(12) United States Patent
Lee

(10) Patent No.: US 12,349,550 B2
(45) Date of Patent: Jul. 1, 2025

(54) DISPLAY APPARATUS INCLUDING AN EMISSION AREA AND A NON-EMISSION AREA AND A CHARGE BLOCKING LAYER INTERPOSED IN AN ORGANIC LAYER

(71) Applicant: LG Display Co., Ltd., Seoul (KR)

(72) Inventor: Eunhyung Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 486 days.

(21) Appl. No.: 17/746,291

(22) Filed: May 17, 2022

(65) Prior Publication Data

US 2022/0367829 A1    Nov. 17, 2022

(30) Foreign Application Priority Data

May 17, 2021  (KR) ......................... 10-2021-0063499

(51) Int. Cl.
  *H10K 59/122*    (2023.01)
  *H10K 50/125*    (2023.01)
  *H10K 50/18*     (2023.01)
  *H10K 101/30*    (2023.01)

(52) U.S. Cl.
  CPC .......... *H10K 59/122* (2023.02); *H10K 50/125* (2023.02); *H10K 50/18* (2023.02); *H10K 2101/30* (2023.02)

(58) Field of Classification Search
  CPC .... H10K 50/18; H10K 50/125; H10K 59/122; H10K 59/131; H10K 2101/30; H10K 59/35; H10K 2102/351; H10K 50/11
  See application file for complete search history.

(56) References Cited

U.S. PATENT DOCUMENTS

| | | | |
|---|---|---|---|
| 9,614,180 B2 * | 4/2017 | Kang | H10K 59/124 |
| 9,806,138 B2 * | 10/2017 | Ikeda | H10K 59/40 |
| 9,859,346 B2 * | 1/2018 | Seo | H10K 50/8445 |
| 10,177,205 B2 * | 1/2019 | Kimura | H10K 50/805 |
| 2013/0248867 A1 * | 9/2013 | Kim | H10K 50/844 |
| | | | 438/34 |
| 2018/0294433 A1 * | 10/2018 | Andou | H10K 59/1315 |
| 2019/0312214 A1 * | 10/2019 | Xia | H10K 85/6574 |

FOREIGN PATENT DOCUMENTS

| | | | |
|---|---|---|---|
| KR | 10-2011-0011943 A | 2/2011 |
| KR | 10-2013-0107883 A | 10/2013 |
| KR | 10-2016-0036941 A | 4/2016 |
| KR | 10-2020-0013499 A | 2/2020 |
| KR | 10-2021-0037949 A | 4/2021 |

* cited by examiner

*Primary Examiner* — Khiem D Nguyen
(74) *Attorney, Agent, or Firm* — Seed IP Law Group LLP

(57) ABSTRACT

A display apparatus according to an embodiment of the present disclosure includes a substrate in which an emission area and a non-emission area are divided and a plurality of sub pixels is defined, a first electrode disposed in each of the plurality of sub pixels, a bank which is disposed on an insulating layer above the substrate and exposes the first electrode through an opening, a trench which is formed by removing a partial area of the bank between the plurality of sub pixels to expose the insulating layer, an organic layer disposed above the substrate in which the bank is disposed, a charge blocking layer interposed in the organic layer in the trench, and a second electrode disposed on the organic layer.

20 Claims, 20 Drawing Sheets

DISPLAY APPARATUS INCLUDING AN EMISSION AREA AND A NON-EMISSION AREA AND A CHARGE BLOCKING LAYER INTERPOSED IN AN ORGANIC LAYER

CROSS-REFERENCE TO RELATED APPLICATIONS

This application claims the priority of Korean Patent Application No. 10-2021-0063499 filed on May 17, 2021, in the Korean Intellectual Property Office, the disclosure of which is incorporated herein by reference.

BACKGROUND

Technical Field

The present disclosure relates to a display apparatus, and more particularly, to a display apparatus which may reduce or minimize emission of a light emitting diode due to leakage current.

Description of the Related Art

Currently, as it enters a full-scale information era, a field of a display apparatus which visually expresses electrical information signals has been rapidly developed and studies are continued to improve performances of various display apparatuses such as a thin-thickness, a light weight, and low power consumption.

Among various display apparatuses, an organic light emitting display apparatus is a self-emitting display apparatus so that a separate light source is not necessary, which is different from the liquid crystal display apparatus. Therefore, the organic light emitting display apparatus may be manufactured to have a light weight and a small thickness. Further, since the organic light emitting display apparatus is driven at a low voltage, it is advantageous not only in terms of power consumption, but also in terms of the color implementation, the response speed, the viewing angle, and the contrast ratio (CR), so that the organic light emitting display apparatus is being studied as next generation displays.

BRIEF SUMMARY

One or more embodiments of the present disclosure provide a display apparatus which applies a multi-stack structure using a lamination of a plurality of light emitting units to implement improved efficiency and lifespan characteristics.

One or more embodiments of the present disclosure provide a display apparatus which applies a leakage current suppressing structure which reduces or minimizes a lateral leakage current in a multi-stack structure.

One or more embodiments of the present disclosure provide a display apparatus which suppresses an electron tunneling phenomenon in a leakage current suppressing structure.

The technical benefits of the present disclosure are not limited to the above-mentioned benefits, and other benefits, which are not mentioned above, can be clearly understood by those skilled in the art from the following descriptions.

According to one embodiment of the present disclosure, a display apparatus may include a substrate in which an emission area and a non-emission area are divided and a plurality of sub pixels is defined, a first electrode disposed in each of the plurality of sub pixels, a bank which is disposed on an insulating layer above the substrate and exposes the first electrode through an opening, a trench which is formed by removing a partial area of the bank between the plurality of sub pixels to expose the insulating layer, an organic layer disposed above the substrate in which the bank is disposed, a charge blocking layer interposed in the organic layer in the trench, and a second electrode disposed on the organic layer.

According to another embodiment of the present disclosure, a display apparatus may include a substrate in which an emission area and a non-emission area are divided and a plurality of sub pixels is defined, a first electrode disposed in each of the plurality of sub pixels, a bank which is disposed on an insulating layer above the substrate and exposes the first electrode through an opening, a spacer which is disposed on the bank between the plurality of sub pixels and has an inversed taper, an organic layer disposed above the substrate on which the bank and the spacer are disposed, a charge blocking layer interposed in the organic layer at a lower end of the spacer, and a second electrode disposed on the organic layer.

Other detailed matters of the embodiments are included in the detailed description and the drawings.

According to the present disclosure, the organic light emitting diode having a multi-stack structure is applied to show a high efficiency and the organic light emitting diode is driven at a low current so that the life span of the organic light emitting diode can be improved.

According to the present disclosure, the leakage current suppressing structure is applied to improve the leakage of current through the side surface of the organic light emitting diode with a multi-stack structure to improve a color gamut.

According to the present disclosure, a charge blocking layer is applied between a charge generation layer and a cathode in a leakage current suppressing structure to improve a bluish color at a low grayscale region, thereby improving a product reliability.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
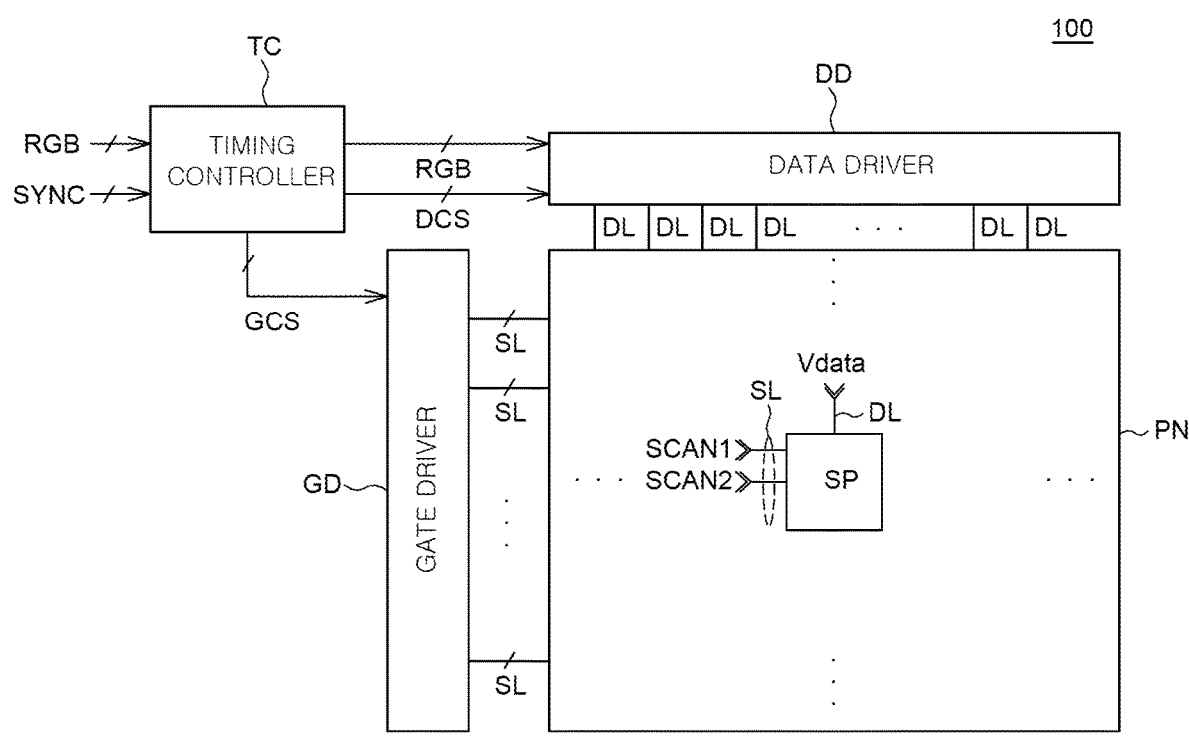
FIG. 1 is a schematic diagram of a display apparatus according to a first embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, dimensions, ratios, angles, the number of elements, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

FIG. 1 is a schematic diagram of a display apparatus according to a first embodiment of the present disclosure.

In FIG. 1, for the convenience of description, among various components of the display apparatus 100, only a display panel PN, a gate driver GD, a data driver DD, and a timing controller TC are illustrated, but the present disclosure is not limited thereto.

Referring to FIG. 1, the display apparatus 100 may include a display panel PN including a plurality of sub pixels SP, a gate driver GD and a data driver DD which supply various signals to the display panel PN, and a timing controller TC which controls the gate driver GD and the data driver DD.

The gate driver GD may supply a plurality of scan signals to a plurality of scan lines SL in accordance with a plurality of gate control signals GCS supplied from the timing controller TC. The plurality of scan signals may include a first scan signal SCAN1 and a second scan signal SCAN2. Even though in FIG. 1, it is illustrated that one gate driver GD is spaced apart from one side of the display panel PN, it is not limited thereto.

The gate driver GD may be disposed in a gate in panel (GIP) manner, the present disclosure is not limited to the number of gate drivers GD and the placement thereof.

The data driver DD may convert image data RGB input from the timing controller TC in accordance with a plurality of data control signals DCS supplied from the timing controller TC into a data signal using a reference gamma voltage. The data driver DD may supply the converted data signal to the plurality of data lines DL.

The timing controller TC may align image data RGB input from the outside to supply the image data to the data driver DD.

The timing controller TC may generate a gate control signal GCS and a data control signal DCS using synchronization signals SYNC input from the outside, such as a dot clock signal, a data enable signal, and horizontal/vertical synchronization signals. The timing controller TC may supply the generated gate control signal GCS and data control signal DCS to the gate driver GD and the data driver DD, respectively, to control the gate driver GD and the data driver DD.

The display panel PN is a configuration which displays images to the user and may include the plurality of sub pixels SP. In the display panel PN, the plurality of scan lines SL and the plurality of data lines DL overlap each other and the plurality of sub pixels SP may be connected to the scan lines SL and the data lines DL, respectively. In addition, even though not illustrated in the drawings, the plurality of sub pixels SP may be connected to a high potential power line, a low potential power line, an initialization signal line, an emission control signal line, and the like.

The sub pixel SP is a minimum unit which configures a screen and each of the plurality of sub pixels SP may include a light emitting diode and a pixel circuit for driving the light emitting diode. The plurality of light emitting diodes may be defined in different ways depending on a type of the display panel PN. For example, when the display panel PN is an organic light emitting display panel, the light emitting diode may be an organic light emitting diode which includes an anode, a light emitting unit, and a cathode. Hereinafter, even though the description will be made under the assumption that the light emitting diode is an organic light emitting diode, the type of the light emitting diode is not limited thereto.

A pixel circuit is a circuit for controlling the driving of the organic light emitting diode. For example, the pixel circuit may be configured to include a plurality of transistors and a capacitor, but is not limited thereto.

Hereinafter, the pixel circuit of the sub pixel SP will be described in more detail with reference to FIG. 2.

Figure 2:
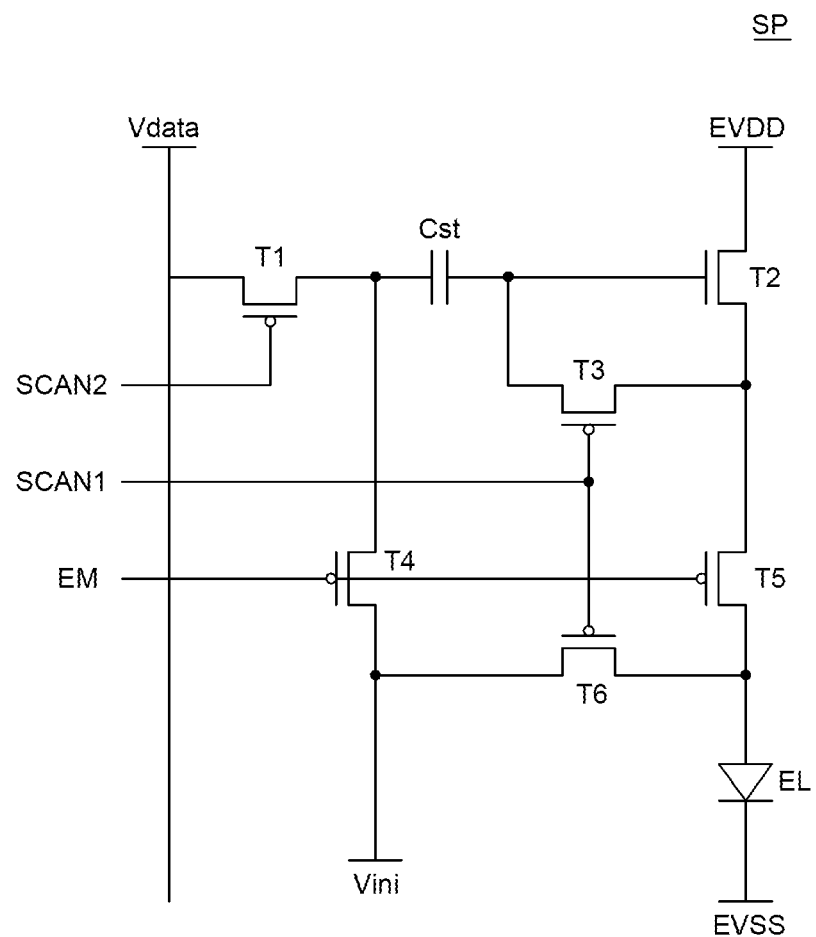
FIG. 2 is a circuit diagram of a sub pixel of a display apparatus according to a first embodiment of the present disclosure.

FIG. 2 is a circuit diagram of a sub pixel of a display apparatus according to a first embodiment of the present disclosure.

Referring to FIG. 2, the pixel circuit of each of the plurality of sub pixels SP may include first to sixth transistors T1, T2, T3, T4, T5, and T6 and a capacitor Cst.

The first transistor T1 is connected to a second scan line to be controlled by a second scan signal SCAN2 supplied through the second scan line. The first transistor T1 may be electrically connected between a data line which supplies a data signal Vdata and the capacitor Cst. When a second scan signal SCAN2 of a turn-on level is applied to the first transistor T1 through the second scan line, the first transistor T1 may transmit the data signal Vdata from the data line to the capacitor Cst. The first transistor T1 may be referred to as a switching transistor which controls a timing at which the data signal Vdata is applied to the capacitor Cst.

The second transistor T2 may be electrically connected between the high potential power line to which a high potential power signal EVDD is supplied and the fifth transistor T5. A gate electrode of the second transistor T2 may be electrically connected to the capacitor Cst. The second transistor T2 may be referred to as a driving transistor which controls a current flowing through the organic light emitting diode EL in accordance with a voltage applied to the gate electrode to control a luminance of the organic light emitting diode EL.

Further, the third transistor T3 may be controlled by the first scan signal SCAN1 supplied through a first scan line. The third transistor T3 may be electrically connected between the gate electrode and a drain electrode of the second transistor T2 or between the gate electrode and the source electrode, depending on the type of the third transistor T3.

In the meantime, the second transistor T2 serving as the driving transistor controls the current flowing through the organic light emitting diode EL in accordance with the data signal Vdata applied to the sub pixel SP. However, a luminance deviation of the organic light emitting diode EL disposed in each sub pixel SP may be caused by a threshold voltage deviation of the second transistor T2 disposed in every sub pixel SP.

At this time, the third transistor T3 is disposed to compensate for the threshold voltage of the second transistor T2 so that the third transistor T3 may be referred to as a compensation transistor. For example, when the first scan signal SCAN1 which turns on the third transistor T3 is applied, a voltage obtained by subtracting the threshold voltage of the second transistor T2 from the high potential power signal EVDD may be applied to the gate electrode of the second transistor T2. In a state in which the high potential power signal EVDD from which the threshold voltage is subtracted is applied to the gate electrode of the second transistor T2, the data signal Vdata is applied to the capacitor Cst to compensate for the threshold voltage of the second transistor T2.

In the meantime, it is illustrated that the third transistor T3 and the first transistor T1 are applied with different scan signals SCAN1 and SCAN2 from different scan lines. However, the third transistor T3 and the first transistor T1 may be connected to the same scan line and may be applied with the same scan signals SCAN1 and SCAN2, and they are not limited thereto.

The fourth transistor T4 may be electrically connected to the capacitor Cst and the initialization signal line to which an initialization signal Vini is supplied. Further, the fourth transistor T4 may be controlled by an emission control signal EM supplied through the emission control signal line. When an emission control signal EM of a turn-on level is applied through the emission control signal line, the fourth transistor T4 may initialize the voltage of the capacitor Cst or slowly discharge the data signal Vdata applied to the capacitor Cst to allow the current in accordance with the data signal Vdata to flow through the organic light emitting diode EL.

The fifth transistor T5 is electrically connected between the second transistor T2 and the organic light emitting diode EL. Further, the fifth transistor T5 may be controlled by an emission control signal EM supplied through the emission control signal line. When an emission control signal EM of a turn-on level is applied in a state in which the data signal Vdata is applied to the capacitor Cst and a high potential power signal EVDD in which the threshold voltage is compensated is applied to the gate electrode of the second transistor T2, the fifth transistor T5 is turned on. Therefore, the current may flow through the organic light emitting diode EL.

The sixth transistor T6 is electrically connected between the initialization signal line through which the initialization signal Vini is supplied, and an anode of the organic light emitting diode EL and may be controlled by the first scan signal SCAN1 supplied through the first scan line.

When a first scan signal SCAN1 of a turn-on level is applied through the first scan line, the sixth transistor T6 may initialize the anode of the organic light emitting diode EL or a node between the second transistor T2 and the fifth transistor T5, with the initialization signal Vini.

The capacitor Cst may be a storage capacitor Cst which stores a voltage applied to the gate electrode of the second transistor T2 serving as a driving transistor. The capacitor Cst may be electrically connected between the gate electrode of the second transistor T2 and the anode of the organic light emitting diode EL. Accordingly, the capacitor Cst may store a difference between the voltage of the gate electrode of the second transistor T2 and a voltage applied to the anode of the organic light emitting diode EL.

It has been described above that the pixel circuit of each of the plurality of sub pixels SP is configured to include the first to sixth transistors T1, T2, T3, T4, T5, and T6 and the capacitor Cst as an example, but the present disclosure is not limited as described above.

Hereinafter, the sub pixel SP of the display apparatus 100 according to the first embodiment of the present disclosure will be described in more detail with reference to FIGS. 3 and 4.

Figure 3:
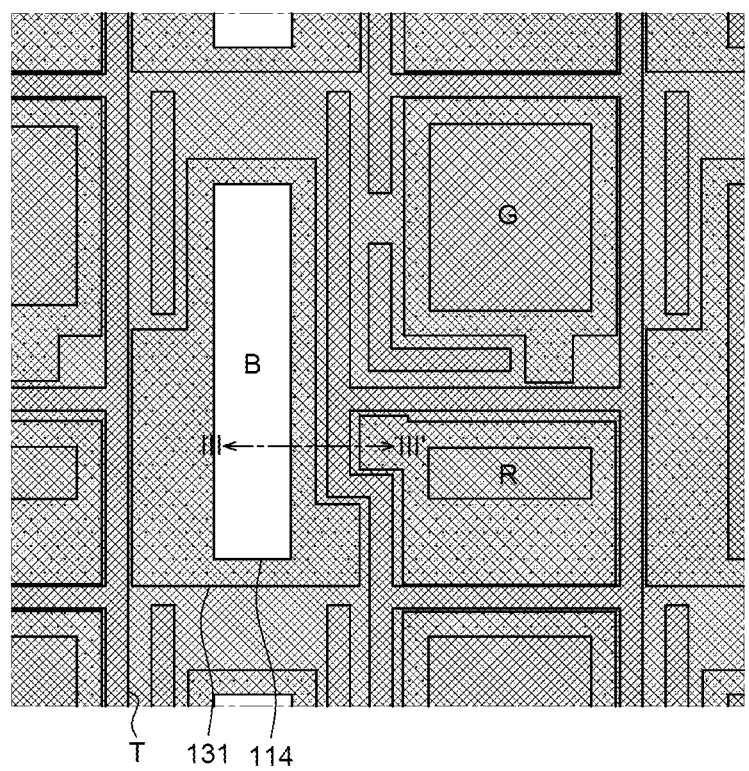
FIG. 3 is an enlarged plan view of a sub pixel according to a first embodiment of the present disclosure.

FIG. 3 is an enlarged plan view of a sub pixel according to a first embodiment of the present disclosure.

Figure 4:
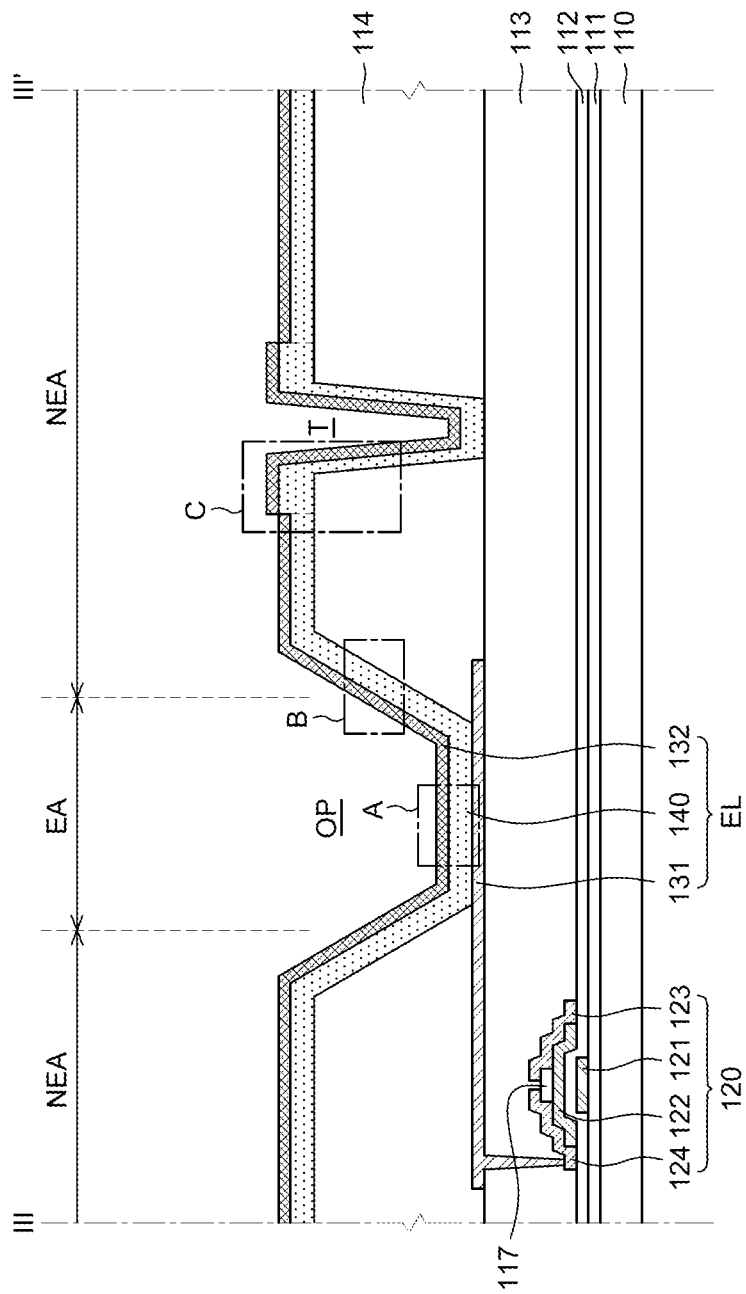
FIG. 4 is a cross-sectional view taken along the line of FIG. 3.

FIG. 4 is a cross-sectional view taken along the line of FIG. 3.

Even though FIG. 3 illustrates that the sub pixels R, G, B have a rectangular shape, the present disclosure is not limited to the shape of the sub pixels R, G, B. In FIG. 4, one arbitrary transistor 120 is included in the cross-sectional structure of FIG. 3. That is, in FIG. 4, for the convenience of description, only one transistor 120 among the plurality of transistors and the capacitor of the pixel circuit of one sub pixel R, G, or B is illustrated. FIG. 4 illustrates a cross-section traversing between two arbitrary sub pixels R and B as an example. However, the present disclosure is not limited to the lower structure of FIG. 4.

The present disclosure is not limited to a real type pixel structure of FIG. 3, but is also applicable to a visual type pixel structure. The leakage current suppressing structure and a deposition level of the organic material of the present disclosure may be the same regardless of the pixel type.

The display apparatus may include a display panel PN including a plurality of sub pixels R, G, and B, a gate driver and a data driver which supply various signals to the display panel PN, and a timing controller which controls the gate driver and the data driver.

Referring to FIGS. 3 and 4, the display panel PN according to the first embodiment of the present disclosure may include a substrate 110, a transistor 120, an organic light emitting diode EL, a bank 114, and an encapsulating unit (not illustrated). The display apparatus 100 may be implemented as a top emission type display apparatus but is not limited thereto.

The display panel PN is a configuration which displays images to the user and may include the plurality of sub pixels R, G, and B. In the display panel PN, the plurality of scan lines and the plurality of data lines overlap and each of the plurality of sub pixels R, G, and B may be connected to the scan line and the data line. In addition, each of the plurality of sub pixels SP may be connected to the high potential power line, the low potential power line, the initialization signal line, the emission control signal line, and the like.

The sub pixel R, G, and B is a minimum unit which configures a screen of the display panel PN and each of the plurality of sub pixels R, G, and B may include an organic light emitting diode EL and a pixel circuit for driving the organic light emitting diode.

The pixel circuit is a circuit for controlling the driving of the organic light emitting diode EL. For example, the pixel circuit may be configured to include a plurality of transistors 120 and a capacitor but is not limited thereto.

The plurality of sub pixels R, G, and B is individual units which emit light and the organic light emitting diode EL may be disposed in each of the plurality of sub pixels R, G, and B. The plurality of sub pixels SP may include a first sub pixel SP1, a second sub pixel SP2, and a third sub pixel SP3 which emit different color light, but is not limited thereto. For example, the first sub pixel R is a red sub pixel, the second sub pixel G is a green sub pixel, and the third sub pixel B is a blue sub pixel, but is not limited thereto.

A region of the plurality of sub pixels R, G, and B may be defined by the bank 114. That is, the bank 114 may be disposed to cover a part of the planarization layer 113 and the first electrode 131 of the organic light emitting diode EL in the plurality of sub pixels R, G, and B.

The substrate 110 may be divided into an emission area EA and a non-emission area NEA. For example, in the non-emission area NEA, the bank 114 is disposed on the first electrode 131 to block the generation of the light in the non-emission area NEA. In contrast, the bank 114 is not disposed in the emission area EA and the organic layer 140 is immediately located on the first electrode 131 to allow the organic layer 140 to generate light.

The bank 114 may include an opening OP which exposes a part of the first electrode 131.

In the meantime, according to the first embodiment of the present disclosure, a leakage current suppressing structure such as a trench T is disposed between the plurality of sub pixels R, G, and B. However, the leakage current suppressing structure is not limited to the trench T, but may include a spacer having an inversed taper and other structures.

The trench T may be patterned together with the opening OP.

In the trench T, the bank 114 is removed to a selected (or predetermined) thickness so that a side surface of the bank 114 may be exposed. Even though in FIG. 4, the entire thickness of the bank 114 is removed to expose the surface of the planarization layer 113, the present disclosure is not limited thereto. Further, even though in FIG. 4, a single trench T is illustrated as an example, the present disclosure is not limited thereto. A plurality of trenches T may be provided between the plurality of sub pixels R, G, and B.

In the trench T according to the first embodiment of the present disclosure, a side surface has a taper with a steeper slope than that of the opening OP of the bank 114. For example, in the emission area EA, the side surface of the opening OP has a taper angle of approximately 5 to 10°, but the side surface of the trench T has a taper angle of approximately 80°. Here, the taper angle refers to an angle formed by the side surface and a horizontal axis.

That is, a path of the leakage current is increased by the trench T to reduce the lateral leakage current. When the organic layer 140 has a multi-stack structure having two or more stacks, the lateral leakage current is generated due to a high mobility of a common layer, for example, a hole injection layer (HIL) and a charge generation layer (CGL). Accordingly, in order to reduce the lateral leakage current, a leakage current suppressing structure such as a spacer having an inversed taper or a trench T is applied. However, when the leakage current suppressing structure is applied, for example, the organic layer 140 is deposited with a thin thickness due to the steep taper angle at an inclined interface of the trench T so that an interval between the charge generation layer and the second electrode 132 is reduced. Therefore, the early turn on (ETO) phenomenon may be generated due to the electron tunneling.

Accordingly, according to the first embodiment of the present disclosure, a charge blocking layer is interposed in the leakage current suppressing structure, that is, the organic layer 140 of the trench T so that the bluish color in the low grayscale region may be improved.

Referring to FIG. 3, for example, the plurality of third sub pixels B is disposed on the same column and the plurality of first sub pixels R and the plurality of second sub pixels G may be alternately disposed on the same column.

To be more specific, the plurality of third sub pixels B is disposed in a second column and a fourth column and the plurality of first sub pixels R and the plurality of sub pixels G may be alternately disposed in a first column and a third column, but the present disclosure is not limited thereto.

For example, the first sub pixel R and the second sub pixel G may be disposed at the left and the right of the third sub pixel B, but is not limited thereto.

Accordingly, in a horizontal direction, the plurality of third sub pixels B and the plurality of first and second sub pixels R and G are alternately disposed. In a vertical direction, the plurality of third sub pixels B is repeatedly disposed or the plurality of first sub pixels R and the plurality of second sub pixels G are alternately disposed. In this case, the trenches T may be disposed between the plurality of sub pixels R, G, and B. For example, the trench T may be vertically disposed between the plurality of third sub pixels B and the plurality of first and second sub pixels R and G and the trench T may be horizontally disposed between the plurality of first sub pixels R and the plurality of second sub pixels G, but the present disclosure is not limited thereto. Here, the horizontal trench T may horizontally extend from the vertical trench T, but is not limited thereto. Some of the plurality of trenches T may be configured as a single type and the others may be configured as a double type.

In the trench T according to the first embodiment of the present disclosure, as described above, the lateral leakage current generated in the multi-stack structure may be reduced. However, the present disclosure is not limited only to the multi-stack structure and may be applied when a lateral leakage current is generated in the normal organic light emitting display apparatus.

Further, the present disclosure is effective to reduce the leakage current generated due to the usage of the common layer due to the process characteristic of the organic light emitting display apparatus, specifically, the leakage current generated due to a strong current path which is formed in the low grayscale region.

Further, the present disclosure may not only reduce the leakage current, but also solve the problem of the bluish color by suppressing the electron tunneling phenomenon. That is, when the leakage current suppressing structure is applied, due to the structural reason, the organic layer 140 is deposited with a thin thickness due to the steeper taper angle at an inclined interface of the trench T so that an interval between the charge generation layer and the second electrode 132 is reduced at the tapered interface. Therefore, the early turn on (ETO) phenomenon may be generated due to the electron tunneling. In this case, after the reliability test, an ETO shift is generated due to the increased resistance of the charge generation layer and a bluish color is caused due to the reduced luminance in a 3-gray region. That is, in the case of the red and green sub pixels R and G that have a relatively high efficiency if they are compensated before the reliability test, the low grayscale compensation is completed by emission of the first light emitting layer due to the ETO phenomenon. After the reliability test, the resistance is increased due to the deterioration of the charge generation layer so that the ETO phenomenon is not generated. Therefore, the red and green sub pixels R and G which are compensated do not emit light so that the color is bluish. Such ETO phenomenon is generated as the interval between the charge generation layer and the second electrode 132 is reduced so that in the trench T, the ETO phenomenon is generated at the tapered interface and in the spacer having an inversed taper, the ETO phenomenon is mainly generated at a lower interface of the spacer. That is, the tapered interface of the trench T and the lower end of the spacer having an inversed taper have a relatively thin deposition thickness of the organic layer 140 as compared with another region so that the interval between the charge generation layer and the second electrode 132 is significantly reduced.

Accordingly, according to the first embodiment of the present disclosure, for example, the charge blocking layer is interposed in the organic layer 140 of the trench T to partially cut a charge moving path of the charge generation layer to suppress the electron tunneling. A detailed description thereof will be described below with reference to FIGS. 5 to 9.

Referring to FIG. 4, the substrate 110 is a support member for supporting other components of the display apparatus and may be configured by an insulating material.

For example, the substrate 110 may be formed of glass or resin. Further, the substrate 110 may be configured to include plastics such as polymer or polyimide PI or may be formed of a material having a flexibility.

The buffer layer 111 may be disposed on the substrate 110. The buffer layer 111 may reduce permeation of moisture or impurities through the substrate 110. The buffer layer 111 may be configured by a single layer or a double layer of silicon oxide SiOx or silicon nitride SiNx, but is not limited thereto. However, the buffer layer 111 may be omitted depending on a type of substrate 110 or a type of transistor, but is not limited thereto.

The transistor 120 may be disposed on the buffer layer 111. The transistor 120 may include a gate electrode 121, an active layer 122, a source electrode 123, and a drain electrode 124.

The transistor 120 illustrated in FIG. 4 is a bottom gate type transistor in which the active layer 122 is disposed on the gate electrode 121 and the source electrode 123 and the drain electrode 124 are disposed on the active layer 122, but the present disclosure is not limited thereto.

The gate electrode 121 may be disposed on the buffer layer 111.

The gate electrode 121 may be configured by a conductive material such as copper (Cu), aluminum (Al), molybdenum (Mo), nickel (Ni), titanium (Ti), chrome (Cr), or an alloy thereof, but is not limited thereto.

A gate insulating layer 112 may be disposed on the gate electrode 121.

The gate insulating layer 112 is an insulating layer which insulates the active layer 122 from the gate electrode 121 and may be configured by a single layer or a double layer of silicon oxide SiOx or silicon nitride SiNx, but is not limited thereto.

The active layer 122 may be disposed on the gate insulating layer 112.

The active layer 122 may be formed of a semiconductor material such as an oxide semiconductor, amorphous silicon, or polysilicon, but is not limited thereto. For example, when the active layer 122 is formed of an oxide semiconductor, the active layer 122 is configured by a channel region, a source region, and a drain region and the source region and the drain region may be conductive regions, but are not limited thereto.

An etch stopper 117 is disposed on the active layer 122. The etch stopper 117 may be additionally formed to suppress the damage of the surface of the active layer 122 due to the plasma when the source electrode 123 and the drain electrode 124 are patterned using an etching method. An end of the etch stopper 117 may overlap the source electrode 123 and the other end may overlap the drain electrode 124. However, the etch stopper 117 may be omitted.

The source electrode 123 and the drain electrode 124 may be disposed on the active layer 122 and the etch stopper 117. The source electrode 123 and the drain electrode 124 which are disposed to be spaced apart from each other may be electrically connected to the active layer 122. The source electrode 123 and the drain electrode 124 may be configured by a conductive material, such as copper (Cu), aluminum (Al), molybdenum (Mo), nickel (Ni), titanium (Ti), chrome (Cr), or an alloy thereof, but are not limited thereto.

The planarization layer 113 may be disposed above the transistor 120. The planarization layer 113 is an insulating layer which planarizes an upper portion of the substrate 110.

The planarization layer 113 may be formed of an organic material, and for example, may be configured by a single layer or a double layer of polyimide or photo acryl, but is not limited thereto. The organic light emitting diode EL may be disposed in each of the plurality of sub pixels R, G, and B, on the planarization layer 113. The organic light emitting diode EL may include a first electrode 131, an organic layer 140, and a second electrode 132. Here, the first electrode 131 may be an anode and the second electrode 132 may be a cathode, but is not limited thereto.

The first electrode 131 may be disposed on the planarization layer 113.

The first electrode 131 is electrically connected to the transistor 120 to be supplied with the driving current of the pixel circuit. The first electrode 131 supplies holes to the light emitting layer so that the first electrode may be formed of a conductive material having a high work function. For example, the first electrode 131 may be formed of a transparent conductive material such as indium tin oxide ITO and indium zinc oxide IZO, but is not limited thereto.

In the meantime, the display apparatus may be implemented by a top emission type or a bottom emission type. When the display apparatus is a top emission type, a reflective layer, which is formed of a metal material having an excellent reflection efficiency such as aluminum (Al) or silver (Ag), may be added below the first electrode 131. Therefore, light emitted from the light emitting layer is reflected from the first electrode 131 to be directed to the upper direction, that is, the second electrode 132. In contrast, when the display apparatus is a bottom emission type, the first electrode 131 may be only formed of a transparent conductive material. Hereinafter, the display apparatus of the present disclosure is assumed as a top emission type.

The first electrode 131, for example, may have a stacked structure having two or more layers including a reflective layer.

The bank 114 may be disposed on the first electrode 131 and the planarization layer 113.

The bank 114 is an insulating layer disposed between the plurality of sub pixels R, G, and B to divide the plurality of sub pixels R, G, and B.

The bank 114 may include an opening OP which exposes a part of the first electrode 131. The bank 114 may be configured by an organic insulating material disposed to cover an edge or a border of the first electrode 131. For example, the bank 114 may be formed of a polyimide resin, an acrylic resin, or a benzocyclobutene (BCB) resin, but is not limited thereto.

A plurality of spacers (not illustrated) may be disposed on the bank 114 of the non-emission area NEA. That is, the spacer may be disposed on the bank 114 of the non-emission area NEA to maintain a constant distance from a deposition mask when the organic light emitting diode EL is formed. A selected (or predetermined) distance may be maintained between the deposition mask and the bank 114 and the first electrode 131 below the spacer by the spacer and a damage due to the contact may be suppressed. The plurality of spacers may be formed to have a shape which is narrower toward the upper portion, for example, a tapered shape, to reduce or minimize an area which is in contact with the deposition mask, but is not limited thereto.

The organic layer 140 may be disposed on the first electrode 131. The organic layer 140 is an area where light is emitted by the coupling of electrons and holes supplied from the first electrode 131 and the second electrode 132. The organic layer 140 may include a light emitting layer disposed in each of the plurality of sub pixels R, G, and B and a common layer commonly disposed for the plurality of sub pixels R, G, and B, but is not limited thereto. The light emitting layer is an organic layer which emits light having a specific color and different light emitting layers may be disposed in a first sub pixel R, a second sub pixel G, and a third sub pixel B. However, the present disclosure is not limited thereto so that a plurality of light emitting layers is provided in all sub pixels R, G, and B to emit white light.

The common layer is an organic layer which is disposed to improve luminous efficiency of the light emitting layer. The common layer may be formed as one layer over the plurality of sub pixels R, G, and B. That is, the common layers of the plurality of sub pixels R, G, and B are connected to be integrally formed. The common layer may include a hole injection layer, a hole transport layer, an electron transport layer, an electron injection layer, a charge generation layer, and the like, but is not limited thereto.

The second electrode 132 may be disposed on the organic layer 140.

The second electrode 132 is an electrode which supplies electrons to the organic light emitting diode EL according to the first embodiment of the present disclosure. The second electrode 132 may be formed of a material having a low work function. The second electrode 132 may include a transparent conductive material. For example, the second electrode 132 may be formed of indium tin oxide ITO, indium zinc oxide IZO, indium gallium zinc oxide IGZO, or the like. Alternatively, the second electrode 132 may include any one of a group consisting of metal materials such as gold (Au), silver (Ag), aluminum (Al), molybdenum (Mo), magnesium (Mg), palladium (Pd), copper (CU), and an alloy thereof. For example, the second electrode 132 may be formed of an alloy of magnesium (Mg) and silver (Ag). Alternatively, the second electrode 132 may be configured by laminating a layer formed of a transparent conductive layer such as indium tin oxide ITO, indium zinc oxide IZO, or indium gallium zinc oxide IGZO and a layer formed of a metal material such as gold (Au), silver (Ag), aluminum (Al), molybdenum (Mo), magnesium (Mg), palladium (Pd), copper (CU), or an alloy thereof, but is not limited thereto.

The second electrode 132 is electrically connected to a low potential power line to be supplied with a low potential power signal.

An encapsulating unit (not illustrated) may be disposed on the second electrode 132.

The encapsulating unit may be disposed above the bank 114 and the organic light emitting diode EL.

The encapsulating unit may block oxygen and moisture permeating into the display apparatus from the outside. For example, when the display apparatus is exposed to the moisture or oxygen, a pixel shrink phenomenon that the emission area is shrunk occurs or a dead pixel in the emission area is generated. Therefore, the encapsulating unit blocks the oxygen and moisture to protect the display apparatus.

The encapsulating unit may include a first encapsulating layer, a second encapsulating layer, and a third encapsulating layer.

The first encapsulating layer is disposed on the second electrode 132 to suppress the permeation of the moisture or oxygen.

For example, the first encapsulating layer may be formed of an inorganic material such as silicon nitride SiNx, silicon oxy nitride SiNxOy, or aluminum oxide AlyOz, but is not limited thereto.

The second encapsulating layer is disposed on the first encapsulating layer to planarize a surface. Further, the second encapsulating layer may cover foreign materials or particles which may be generated during a manufacturing process of the display apparatus. The second encapsulating layer may be formed of an organic material, such as silicon oxy carbon SiOxCz, acryl or epoxy resin, but is not limited thereto.

The third encapsulating layer is disposed on the second encapsulating layer to suppress the permeation of the moisture or oxygen. For example, the third encapsulating layer may be formed of an inorganic material such as silicon nitride SiNx, silicon oxy nitride SiNxOy, silicon oxide SiOx, or aluminum oxide AlyOz, but is not limited thereto.

In the meantime, various organic light emitting diode structures for improving the efficiency and the lifespan of the organic light emitting diode and reducing power consumption are proposed to improve a quality and a productivity of the organic light emitting display apparatus.

Accordingly, an organic light emitting diode with a tandem structure which uses a plurality of stacks, that is, a lamination of a plurality of electroluminescent units is proposed to implement the improved efficiency and lifespan characteristic, as well as an organic light emitting diode which applies one stack, that is, one electroluminescent unit. Hereinafter, for the sake of convenience, a double-stack tandem structure will be described as an example.

In the organic light emitting diode EL with a tandem structure, that is, a double-stack structure using a lamination of a first electroluminescent unit and a second electroluminescent unit, an emission area where light is emitted by recombination of the electrons and the holes is disposed in each of the first electroluminescent unit and the second electroluminescent unit. Therefore, the light emitted from a first light emitting layer of the first electroluminescent unit and a second light emitting layer of the second electroluminescent unit cause constructive interference to provide high luminance as compared with the organic light emitting diode with a single stack structure.

Hereinafter, the stack structure according to the first embodiment of the present disclosure will be described in detail with reference to FIGS. 5A to 5C together.

Figure 5A:
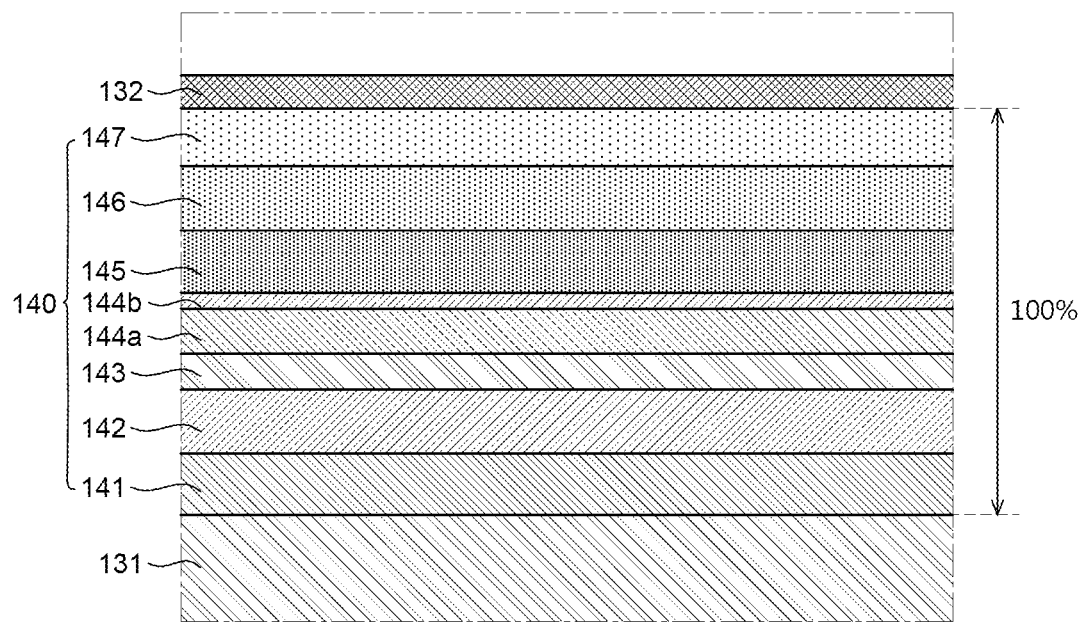
FIG. 5A is an enlarged cross-sectional view of a portion A in FIG. 4.

FIG. 5A is an enlarged cross-sectional view of a portion A in FIG. 4.

Figure 5B:
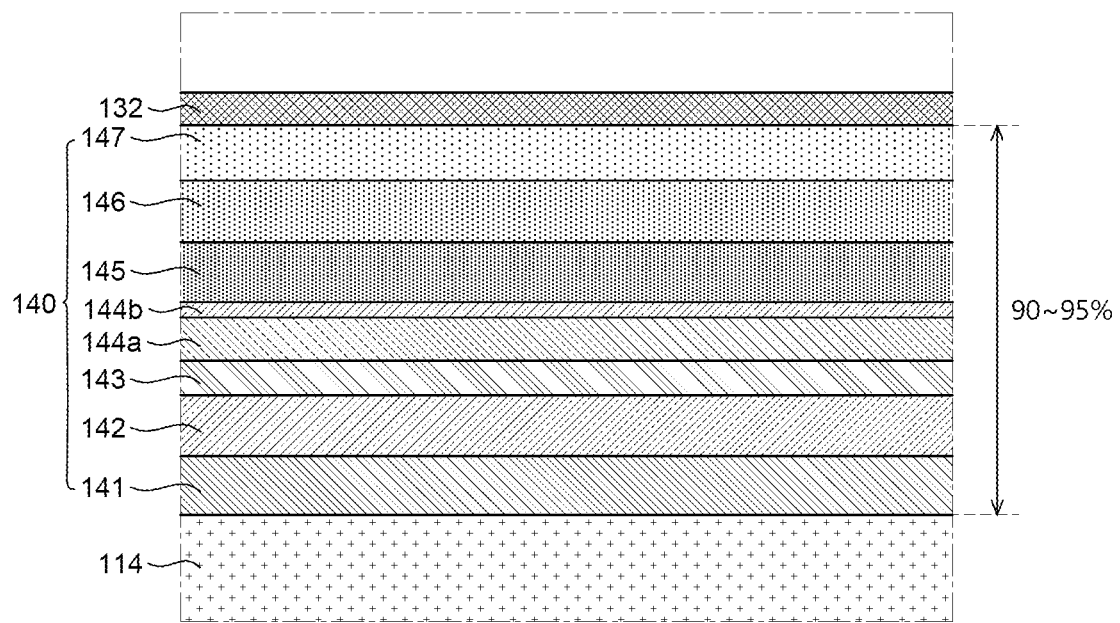
FIG. 5B is an enlarged cross-sectional view of a portion B in FIG. 4.

FIG. 5B is an enlarged cross-sectional view of a portion B in FIG. 4.

Figure 5C:
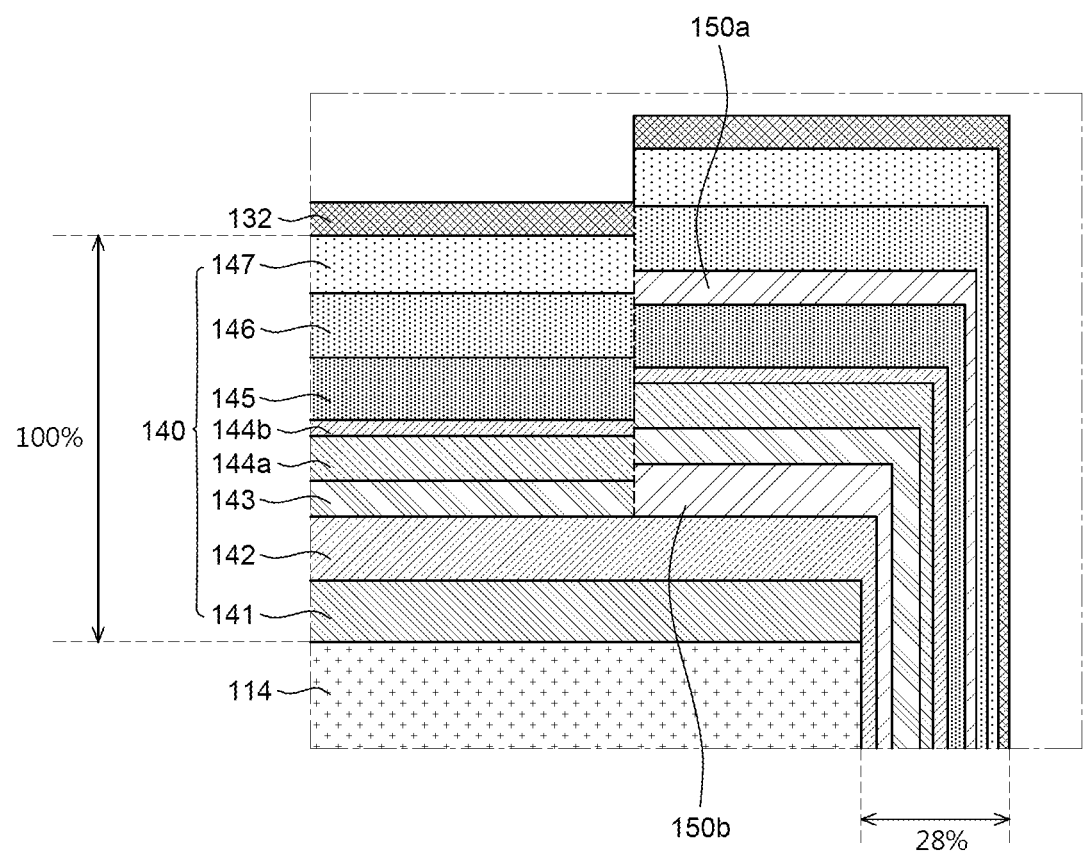
FIG. 5C is an enlarged cross-sectional view of a portion C in FIG. 4.

FIG. 5C is an enlarged cross-sectional view of a portion C in FIG. 4.

Figure 6:
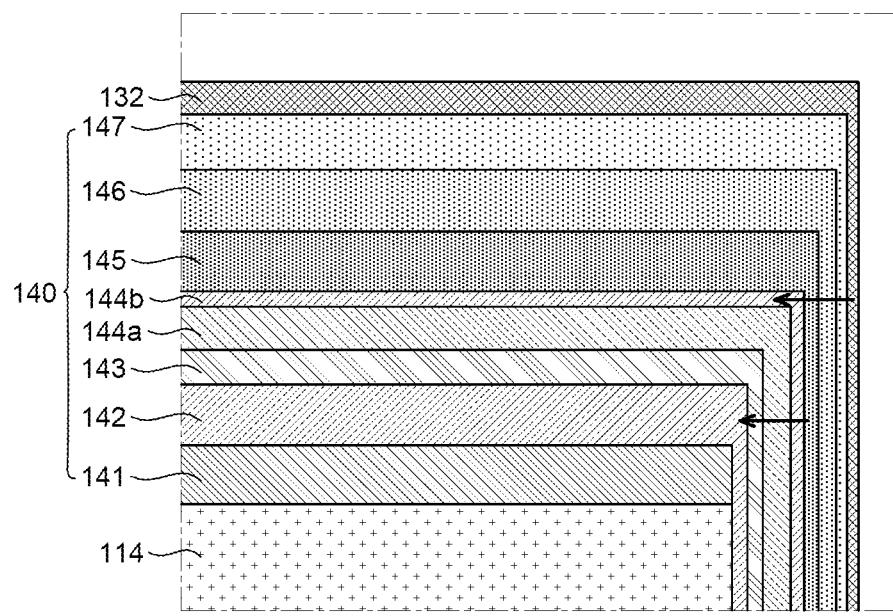
FIG. 6 is an enlarged cross-sectional view of a sub pixel according to a comparative embodiment.

FIG. 6 is an enlarged cross-sectional view of a sub pixel according to a comparative embodiment.

Figure 7:
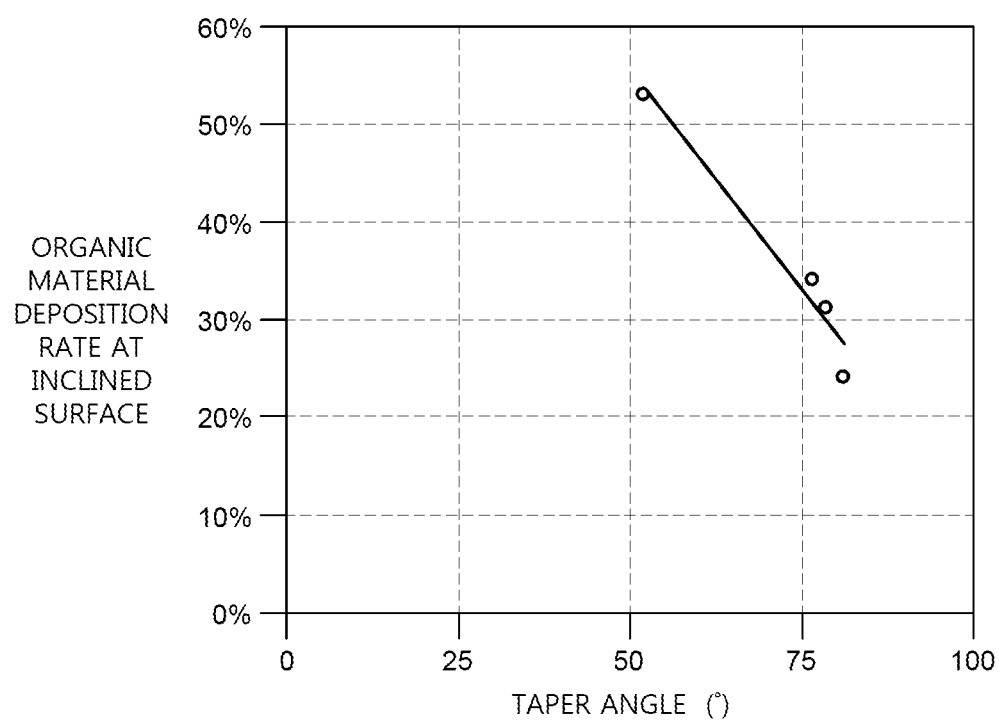
FIG. 7 is a graph showing an example of a deposition level of an organic material according to a taper angle of a trench.

FIG. 7 is a graph showing an example of a deposition level of an organic material according to a taper angle of a trench.

Figure 8A:
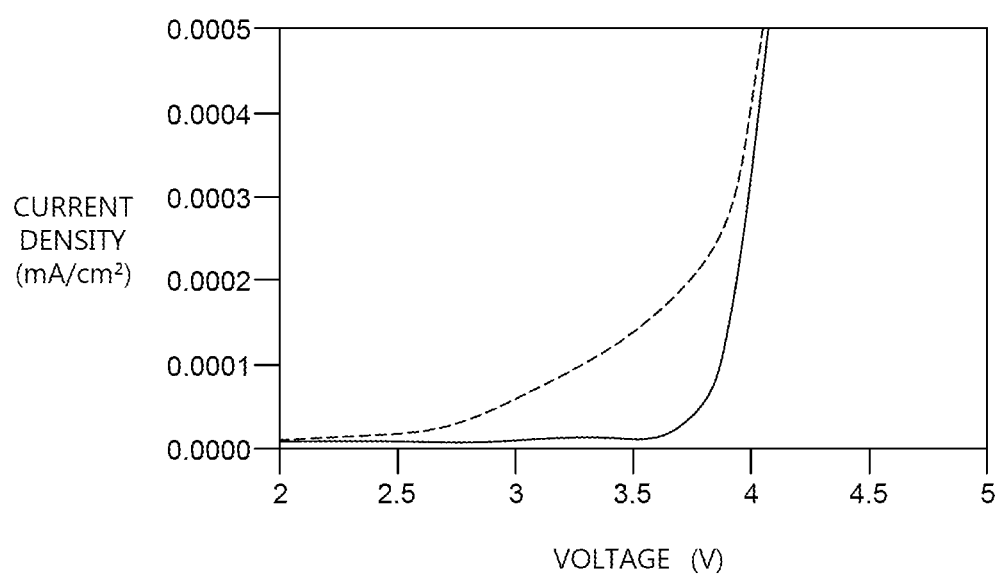
FIGS. 8A to 8C are graphs illustrating an example of a current density according to a voltage in red, green, and blue sub pixels.
Figure 8B:
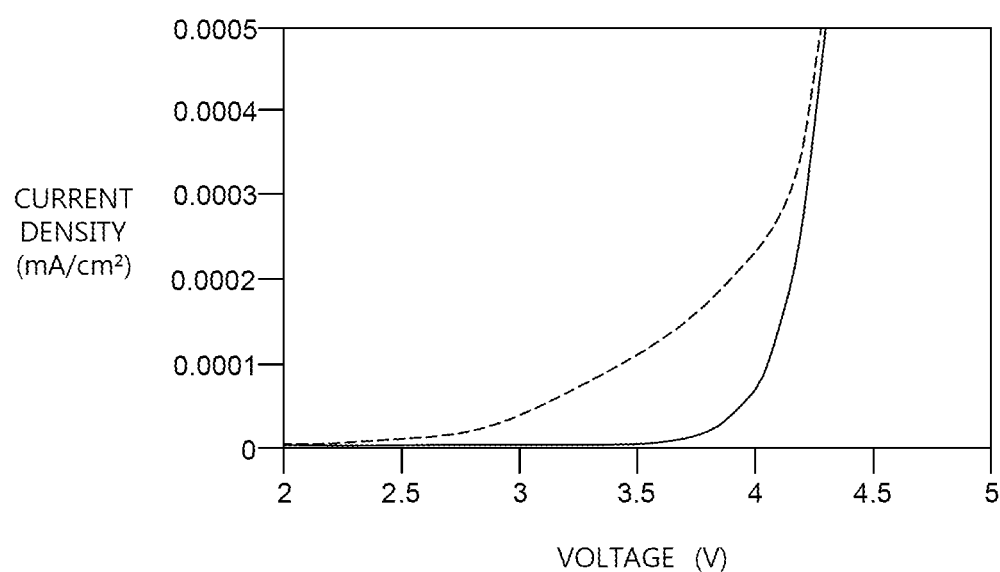
Figure 8C:
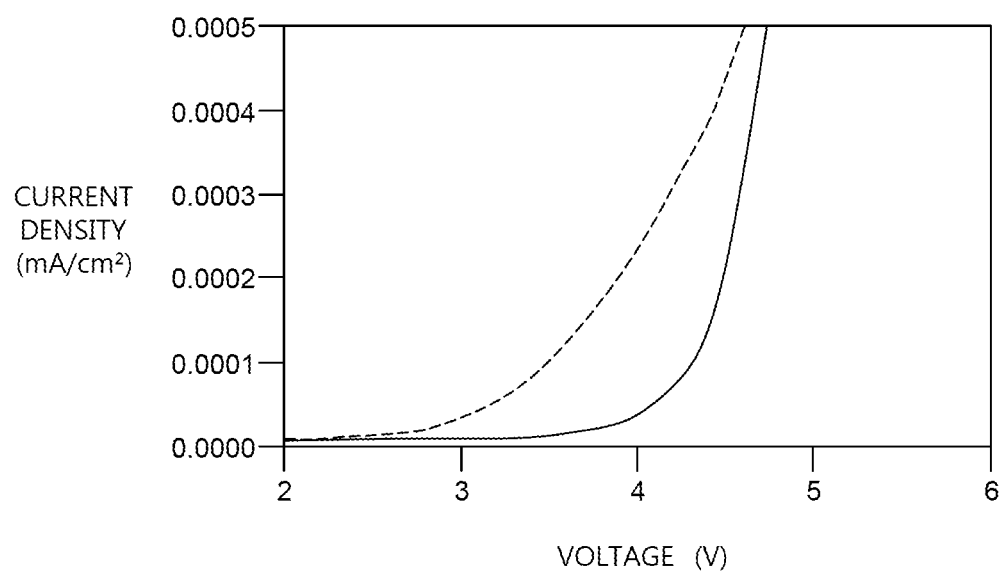

FIGS. 8A to 8C are graphs illustrating an example of a current density according to a voltage in red, green, and blue sub pixels.

Figure 9A:
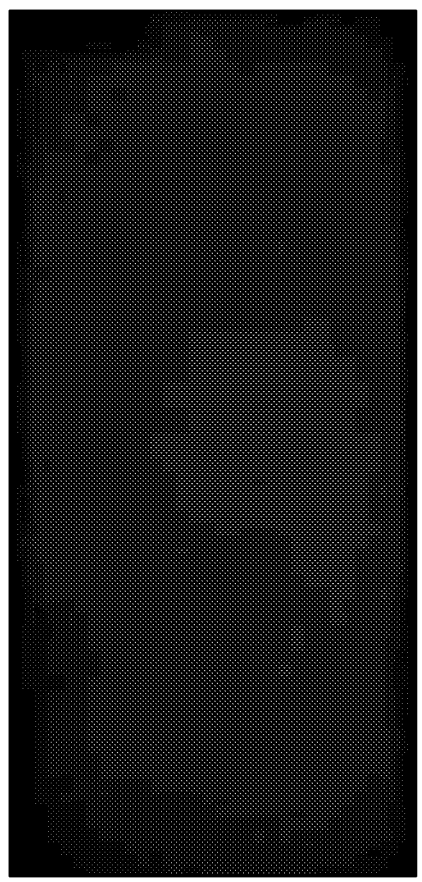
FIGS. 9A and 9B are photographs illustrating a reliability result of a display panel.
Figure 9B:
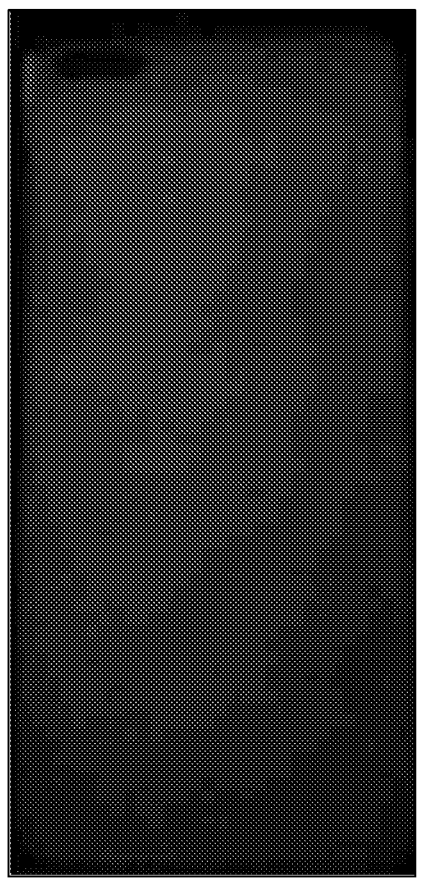

FIGS. 9A and 9B are photographs illustrating a reliability result of a display panel.

FIG. 5A is an enlarged cross sectional view of an organic light emitting diode EL in a flat portion A of an emission area EA. FIG. 5B is an enlarged cross sectional view of an organic light emitting diode EL in a tapered portion B of an emission area EA. FIG. 5C is an enlarged cross sectional view of an organic light emitting diode EL in a tapered portion C of a trench T.

For example, in the flat portion A of the emission area EA (or an opening OP), the taper angle is approximately 0° and in the tapered portion B of the emission area EA, the taper angle is approximately 5 to 10°, and in the tapered portion C of the trench T, the taper angle is approximately 80°. At this time, in the tapered portion C of the trench T and the tapered portion B of the emission area EA, a deposition thickness of the organic layer 140 is thinner than that of the flat portion A of the emission area EA. Further, the deposition thickness of the organic layer 140 in the tapered portion C of the trench T is thinner than that of the tapered portion B of the emission area EA. For example, when it is assumed that the deposition thickness of the organic layer 140 of the flat portion A of the emission area EA is 100% (see FIG. 5A), a thickness of the organic layer 140 of the tapered portion B of the emission area EA is approximately 90 to 95% (see FIG. 5B). Further, a thickness of the organic layer 140 of the tapered portion C of the trench T may be approximately 28% (see FIG. 5C).

In FIG. 6, the same configuration as the sub pixel of FIG. 5C is illustrated except that the charge blocking layer is excluded. Therefore, the redundant description of the same configuration will be omitted.

Referring to FIGS. 4, 5A to 5C, the organic layer 140 with a stack structure may include charge generation layers 144a and 144b disposed between the first electrode 131 and the second electrode 132, a first stack, and a second stack. The first stack is disposed between the charge generation layers 144a and 144b and the first electrode 131 and the second stack is disposed between the second electrode 132 and the charge generation layers 144a and 144b. The charge generation layers 144a and 144b are disposed between the first stack and the second stack to generate charges. The charge generation layers 144a and 144b may be formed with a structure in which a p-type charge generation layer 144b and an n-type charge generation layer 144a are laminated. That is, the charge generation layers 144a and 144b may be configured by a p-type charge generation layer 144b and an n-type charge generation layer 144a which generate positive charges and negative charges to both directions and substantially may serve as electrodes.

Each of the first stack and the second stack may include at least one or more light emitting layers 142 and 146 and include common layers above and below each light emitting layer 142 and 146 with the light emitting layers 142 and 146 therebetween. For example, specifically, the first stack may include a first hole transport layer 141, a first light emitting layer 142, and a first electron transport layer 143. Further, the second stack may include a second hole transport layer 145, a second light emitting layer 146, and a second electron transport layer 147. Further, the first and second stacks may further include first and second hole injection layers and first and second electron injection layers.

In the case of the organic light emitting diode EL as described above, when a voltage is applied between the first electrode 131 and the second electrode 132, lateral leakage current is generated in a side surface direction of the organic light emitting diode EL through the common layer formed in the organic light emitting diode EL, for example, the charge generation layers 144a and 144b. Therefore, the color mixture problem in that not only a sub pixel which is required to emit light, but also an adjacent sub pixel which is not required to emit light emit light is caused.

The color mixture problem may be more significant in the organic light emitting diode EL with a double-stack structure using a lamination of the first electroluminescent unit and the second electroluminescent unit using light constructive interference than in an organic light emitting diode with a single stack structure.

Therefore, according to the first embodiment of the present disclosure, the trench T is formed between the plurality of sub pixels to increase a current path, thereby reducing or minimizing the leakage current during the driving of the display apparatus with a multi-stack structure.

Further, according to the first embodiment of the present disclosure, the charge blocking layers 150a and 150b are interposed in the organic layer 140 of the leakage current suppressing structure, that is, the trench T so that the bluish color in the low grayscale region may be improved. For example, the first charge blocking layer 150a may be interposed between the charge generation layers 144a and 144b and the second electrode 132 and the second charge blocking layer 150b may be interposed between the charge generation layers 144a and 144b and the first electrode 131, but the present disclosure is not limited thereto.

According to the present disclosure, a cross-sectional shape of the trench T may be the same regardless of whether the trench T is a single structure or a double structure. Further, the cross-sectional shape of the trench T may be the same regardless of whether the trenches T are horizontally disposed or vertically disposed. Therefore, in some embodiments, the trenches T may be simultaneously formed by the same process using one mask and the charge blocking layers 150a and 150b may also be simultaneously formed.

Referring to FIGS. 4 and 5A, in the flat portion A of the emission area EA, the taper angle may be approximately 0°. In this case, the deposition rate of the organic material may be considered as 100%.

In contrast, referring to FIGS. 4 and 5B, in the tapered portion B of the emission area EA, the taper angle may be approximately 5 to 10°. In this case, the deposition rate of the organic material may be approximately 90 to 95% and when a thickness of the organic layer 140 of the flat portion A of the emission area EA may be assumed as 100%, a thickness of the organic layer 140 of the tapered portion B of the emission area EA may be approximately 90 to 95%.

Referring to FIGS. 4, 5C, and 7, a taper angle in the tapered portion C of the trench T may be approximately 80°. It is understood that the deposition rate of the organic material on an inclined surface is reduced in proportion to a taper angle and in this case, the deposition rate of the organic material is 20 to 30% of that of the flat portion A, for example, may be 28%. In this case, when a thickness of the organic layer 140 of the flat portion A of the emission area EA is assumed as 100%, a thickness of the organic layer 140 of the tapered portion C of the trench T may be approximately 28%.

Referring to FIG. 6, in the tapered portion of the trench of the comparative embodiment, the deposition rate of the organic material is decreased due to a steep taper angle so that the organic layer 140 is deposited with a thin thickness. Therefore, the interval between the charge generation layers 144a and 144b and the second electrode 132 may be reduced at the tapered interface of the trench. This is because the organic material is formed by a fine metal mask (FMM) so that the electron tunneling is formed in an arrow direction, which may cause the early turn on (ETO) phenomenon.

Referring to FIGS. 4 and 5C, according to the first embodiment of the present disclosure, the charge blocking layers 150a and 150b are interposed in the organic layer 140 of the trench T. For example, the first charge blocking layer 150a may be interposed between the charge generation layers 144a and 144b and the second electrode 132 and the second charge blocking layer 150b may be interposed between the charge generation layers 144a and 144b and the first electrode 131. In FIG. 5C, an example that the first charge blocking layer 150a is interposed between the second hole transport layer 145 and the second light emitting layer 146 and the second charge blocking layer 150b is interposed between the first light emitting layer 142 and the first electron transport layer 143 has been illustrated. However, the present disclosure is not limited thereto. The first and second charge blocking layers 150a and 150b may extend to the emission area EA at the inclined interface of the trench T by a selected (or predetermined) distance. Accordingly, the organic layer 140 including the extended first and second charge blocking layers 150a and 150b has a thickness larger than that of the organic layer 140 in the other portion so that a step may be formed on the surface of the organic light emitting diode EL.

ETO is generated due to the reduced thickness between the p-type charge generation layer 144b and the second electrode 132 so that the first charge blocking layer 150a may be interposed between the p-type charge generation layer 144b in the organic layer 140 of the trench T and the second electrode 132. At this time, the first charge blocking layer 150a is interposed between the second electrode 132 and the charge generation layers 144a and 144b at the inclined interface of the trench T to suppress the above-described electron tunneling. Further, in order not to allow the first light emitting layer 142 to emit light, the second charge blocking layer 150b may be further interposed between the first light emitting layer 142 and the p-type charge generation layer 144b in the organic layer 140 of the trench T. In this case, the charge moving path of the charge generation layers 144a and 144b may be partially cut by means of the thickness of the second charge blocking layer 150b.

As another example, in order to suppress the injection of the electron, the first charge blocking layer 150a is formed before depositing the second electron 132 and in order not to allow the first light emitting layer 142 to emit light, the second charge blocking layer 150b may be further formed after depositing the first light emitting layer 142.

As described above, the charge blocking layers 150a and 150b are interposed in the organic layer 140 of the trench T to partially cut the charge moving path of the charge generation layers 144a and 144b by means of the thickness of the charge blocking layers 150a and 150b. By doing this, the electron tunneling may be blocked.

The charge blocking layers 150a and 150b may be configured by a high resistive non-conductive organic material which suppresses the electron tunneling phenomenon between the charge generation layers 144a and 144b and the second electrode 132 or a conductive organic material having a low lowest unoccupied molecular orbital LUMO value.

The high resistive non-conductive organic material has a non-conductive property and similar to the other deposition conductive organic material, may include polycarbonate PC and poly methyl methacrylate PMMA having a glass transition temperature of 110° C. or higher.

The conductive organic material having a low LUMO value is a material having a LUMO value of −2.5 eV or lower and may include a material having a work function level of 5.6 eV of the hole injection layer and the light emitting layer, such as TCTA[4,4',4''-tris(n-carbazolyl)-triphenylamine], NPD[N,N-Di(1-naphthyl)-N,N'-diphenyl-(1, 1'-biphenyl)-4,4'-diamine], and TPD[N,N'-Bis(3-methylphenyl)-N,N'-diphenylbenzidine].

As the deposition thickness is increased, the resistance of the charge blocking layers 150a and 150b according to the first embodiment of the present disclosure is increased so that it is advantageous to suppress the electron tunneling. Further, the charge blocking layers 150a and 150b may have a minimum thickness of 100 Å or larger to cut the path of the lateral leakage current of the charge generation layers 144a and 144b.

FIG. 8A illustrates an example of a current density according to a voltage in a red sub pixel, FIG. 8B illustrates an example of a current density according to a voltage in a green sub pixel, and FIG. 8B illustrates an example of a current density according to a voltage in a blue sub pixel.

In FIGS. 8A to 8C, a dotted line graph illustrates a result of the comparative embodiment, as an example, in which the charge blocking layer is not interposed and a solid line graph illustrates a result of the embodiment, as an example, in which the charge blocking layer is interposed.

Referring to FIGS. 8A to 8C, it is understood that in the embodiment that the charge blocking layer is interposed in the organic layer of the trench, a J-V curve moves to a right side and the driving voltage is increased so that the ETO is suppressed as compared with the comparative embodiment.

FIG. 9A illustrates a reliability result for a display panel of the comparative embodiment in which the charge blocking layer is not interposed and FIG. 9B illustrates a reliability result for a display panel of the embodiment in which the charge blocking layer is interposed.

Referring to FIGS. 9A and 9B, according to the UV reliability result for the display panel, it is understood that in the embodiment in which the charge blocking layer is interposed, the luminance is reduced in a low grayscale 3-gray as compared with the comparative embodiment, to improve the bluish color.

Figure 10:
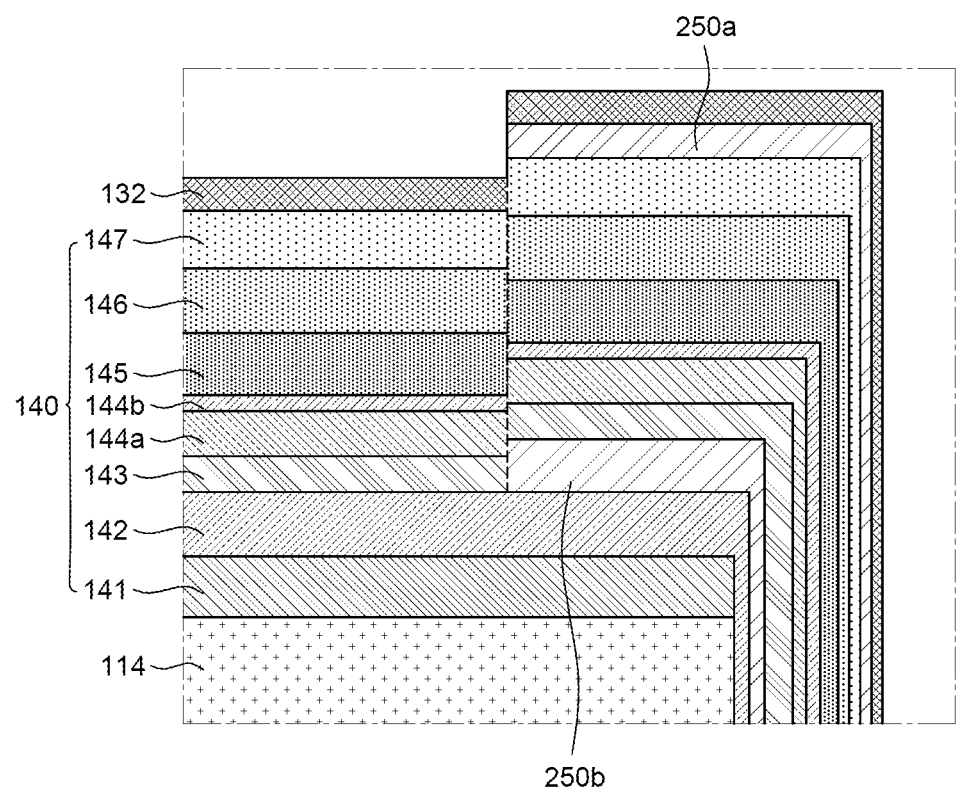
FIG. 10 is an enlarged cross-sectional view of a sub pixel according to a second embodiment of the present disclosure.

FIG. 10 is an enlarged cross-sectional view of a sub pixel according to a second embodiment of the present disclosure.

A second embodiment of the present disclosure illustrated in FIG. 10 is configured by the substantially same configuration as the first embodiment of the present disclosure except that a first charge blocking layer 250a is located between the second electron transport layer 147 and the second electrode 132. Therefore, the redundant description of the same configuration will be omitted.

FIG. 10 is an enlarged cross-sectional view of the organic light emitting diode with a stack structure in a tapered portion of the trench.

Referring to FIG. 10, as described above, the organic layer 140 with a stack structure may include charge generation layers 144a and 144b disposed between the first electrode 131 and the second electrode 132, a first stack, and a second stack. The first stack is disposed between the charge generation layers 144a and 144b and the first electrode 131 and the second stack is disposed between the second electrode 132 and the charge generation layers 144a and 144b. The charge generation layers 144a and 144b may be formed with a structure in which a p-type charge generation layer 144b and an n-type charge generation layer 144a are laminated.

Each of the first stack and the second stack may include at least one or more light emitting layers 142 and 146 and include common layers above and below each light emitting layer 142 and 146 with the light emitting layers 142 and 146 therebetween. For example, specifically, the first stack may include a first hole transport layer 141, a first light emitting layer 142, and a first electron transport layer 143. Further, the second stack may include a second hole transport layer 145, a second light emitting layer 146, and a second electron transport layer 147. Further, the first and second stacks may further include first and second hole injection layers and first and second electron injection layers.

In the meantime, according to the second embodiment of the present disclosure, the trench is formed between the plurality of sub pixels to increase a current path, thereby reducing or minimizing the leakage current during the driving of the display apparatus, specifically, with a multi-stack structure.

Further, according to the second embodiment of the present disclosure, charge blocking layers 250a and 250b are interposed in the organic layer 140 of the trench. Specifically, according to the second embodiment of the present disclosure, in order to suppress the injection of the electron, the first charge blocking layer 250a may be formed before depositing the second electron 132 and in order not to allow the first light emitting layer 142 to emit light, the second charge blocking layer 250b may be formed after depositing the first light emitting layer 142. That is, the first charge blocking layer 250a according to the second embodiment of the present disclosure may be located between the second electron transport layer 147 and the second electrode 132. Further, the second charge blocking layer 250b may be located between the first light emitting layer 142 and the first electron transport layer 143, but the present disclosure is not limited thereto.

In the meantime, the first and second charge blocking layers 250a and 250b may extend to the emission area at the inclined interface of the trench by a selected (or predetermined) distance. Accordingly, the organic layer 140 including the extended first and second charge blocking layers 250a and 250b has a thickness larger than that of the organic layer 140 in the other portion so that a step may be formed on the surface of the organic light emitting diode.

In the meantime, according to the present disclosure, only the first charge blocking layer may be provided, which will be described in more detail with a third embodiment of the present disclosure.

Figure 11:
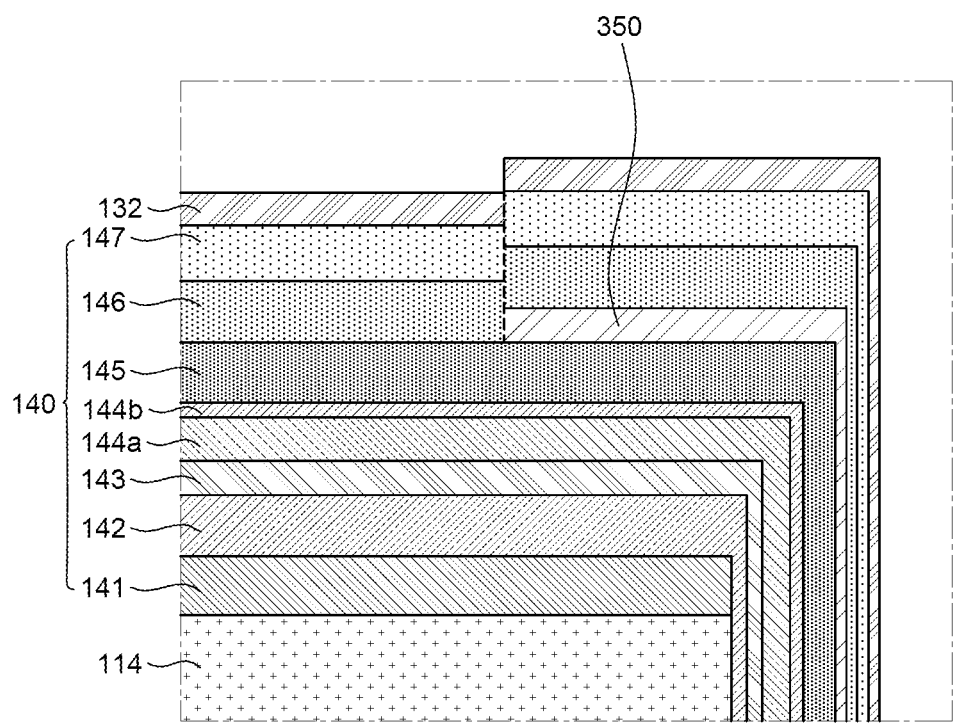
FIG. 11 is an enlarged cross-sectional view of a sub pixel according to a third embodiment of the present disclosure.

FIG. 11 is an enlarged cross-sectional view of a sub pixel according to a third embodiment of the present disclosure.

A third embodiment of the present disclosure illustrated in FIG. 11 is configured by the substantially same configuration as the first embodiment of the present disclosure except that a single charge blocking layer 350 is provided between the charge generation layers 144a and 144b and the second electrode 132. Therefore, the redundant description of the same configuration will be omitted.

FIG. 11 is an enlarged cross-sectional view of the organic light emitting diode with a stack structure in a tapered portion of the trench.

Referring to FIG. 11, according to the third embodiment of the present disclosure, the trench is formed between the plurality of sub pixels to increase a current path, thereby reducing or minimizing the leakage current during the driving of the display apparatus, specifically, with a multi-stack structure.

According to the third embodiment of the present disclosure, a single charge blocking layer 350 is interposed between the charge generation layers 144a and 144b and the second electrode 132 in the organic layer 140 of the trench. Specifically, the charge blocking layer 350 according to the third embodiment of the present disclosure may be located between the hole transport layer 145 and the second light emitting layer 146, but the present disclosure is not limited thereto. As another example, the charge blocking layer 350 according to the third embodiment of the present disclosure may be located between the second electron transport layer 147 and the second electrode 132.

In the meantime, the charge blocking layer 350 may extend to the emission area at the inclined interface of the trench by a selected (or predetermined) distance. Accordingly, the organic layer 140 including the extended charge blocking layer 350 has a thickness larger than that of the organic layer 140 in the other portion so that a step may be formed on the surface of the organic light emitting diode.

In the meantime, according to the present disclosure, as the leakage current suppressing structure, a spacer having an inversed taper may be applied in addition to the above-described trench, which will be described in detail with a fourth embodiment of the present disclosure.

Figure 12:
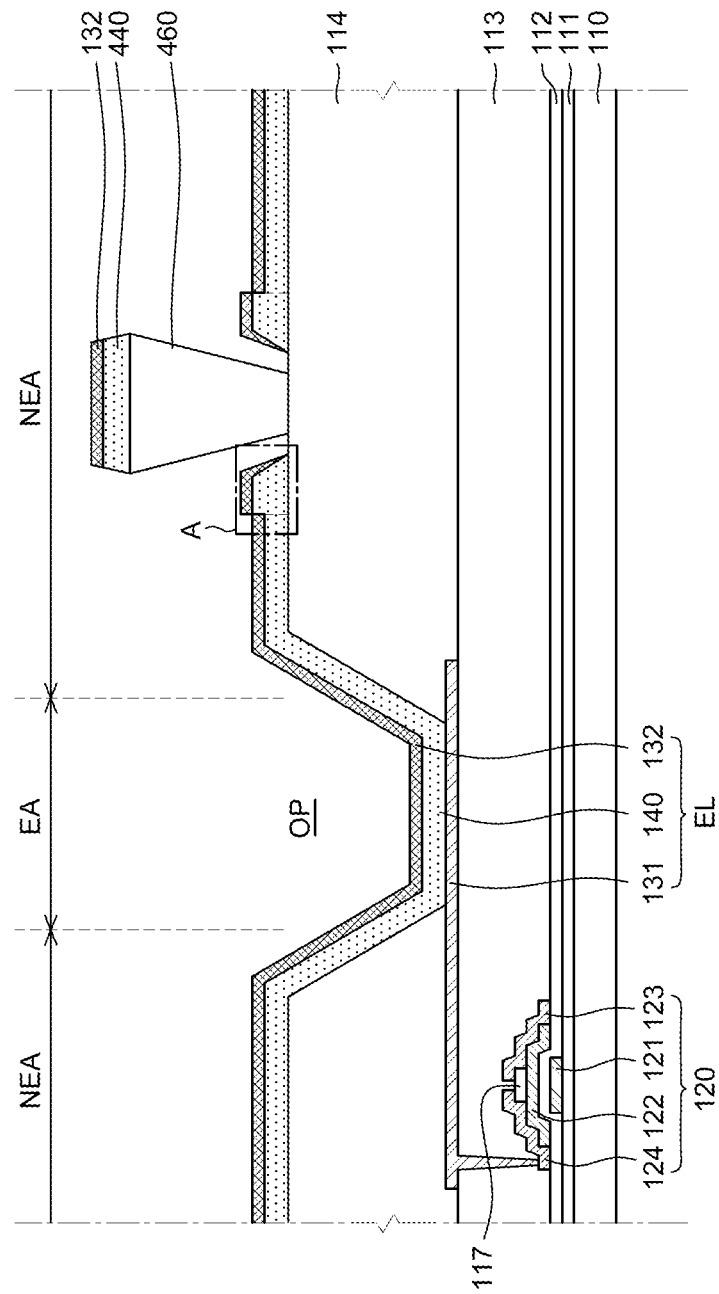
FIG. 12 is a cross-sectional view of a sub pixel according to a fourth embodiment of the present disclosure.

FIG. 12 is a cross-sectional view of a sub pixel according to a fourth embodiment of the present disclosure.

Figure 13:
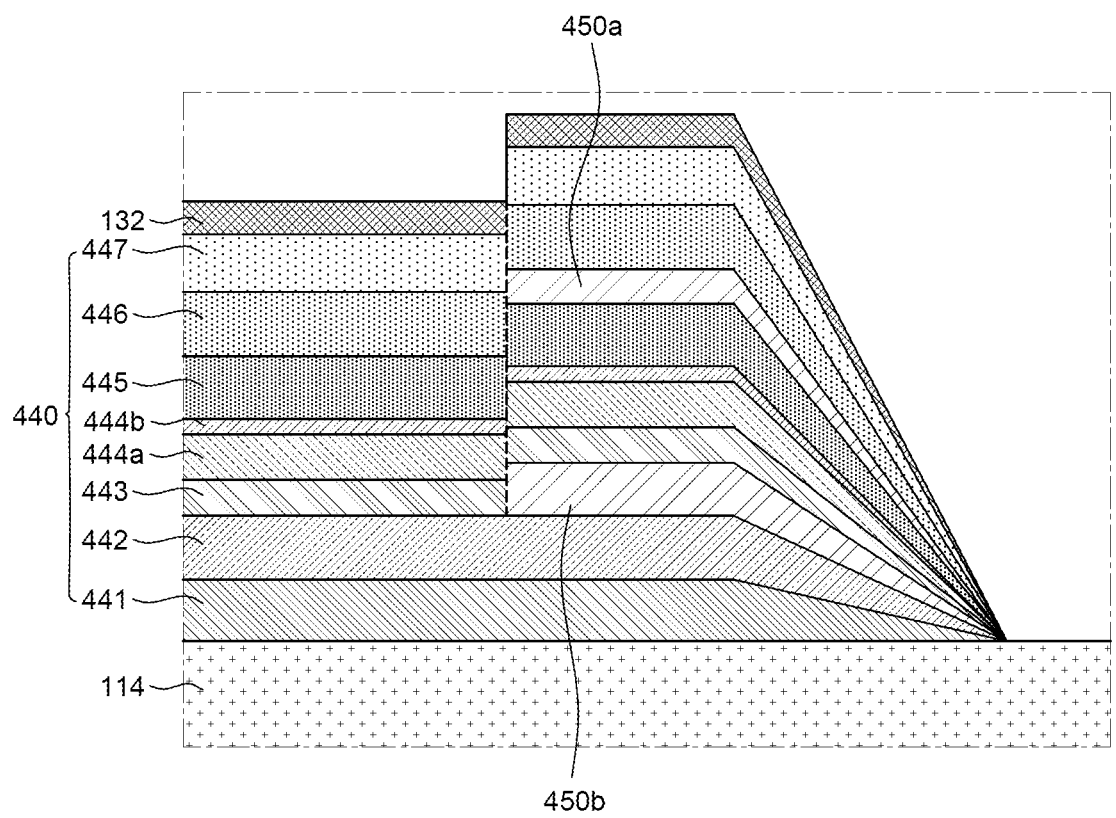
FIG. 13 is an enlarged cross-sectional view of a portion A in FIG. 12.

FIG. 13 is an enlarged cross-sectional view of a portion A in FIG. 12.

In FIG. 12, one arbitrary transistor 120 is included. That is, in FIG. 12, for the convenience of description, only one transistor 120 among the plurality of transistors and the capacitor of the pixel circuit of one sub pixel is illustrated. However, the present disclosure is not limited to the lower structure of FIG. 12.

FIG. 13 is an enlarged cross-sectional view of an organic light emitting diode EL including an inclined interface at a lower end of a spacer 460 having an inversed taper.

Referring to FIGS. 12 and 13, the display panel according to the fourth embodiment of the present disclosure may include a substrate 110, a transistor 120, an organic light emitting diode EL, a bank 114, and an encapsulating unit (not illustrated).

In the meantime, according to the fourth embodiment of the present disclosure, a leakage current suppressing structure such as a spacer (or a partition) 460 having an inversed taper is disposed between the plurality of sub pixels.

The spacer 460 having an inversed taper may be formed of a selected (or predetermined) organic material on the bank 114 of the non-emission area NEA. Even though in FIG. 12, a spacer 460 having a single inversed taper is illustrated as an example, the present disclosure is not limited thereto. A plurality of spacers 460 having an inversed taper may be provided between the plurality of sub pixels.

According to the fourth embodiment of the present disclosure, the organic layer 440 and the second electrode 132 deposited on the spacer 460 having an inversed taper may be disconnected from the organic layer 440 and the second electrode 132 deposited in the emission area EA due to the spacer 460 having an inversed taper. By doing this, the lateral leakage current may be blocked.

Referring to FIGS. 12 and 13, as described above, the organic layer 440 with a stack structure may include charge generation layers 444a and 444b disposed between the first electrode 131 and the second electrode 132, a first stack and a second stack. The first stack may be disposed between the charge generation layers 444a and 444b and the first electrode 131 and the second stack may be disposed between the second electrode 132 and the charge generation layers 444a and 444b. The charge generation layers 444a and 444b may be formed with a structure in which a p-type charge generation layer 444b and an n-type charge generation layer 444a are laminated.

Each of the first stack and the second stack may include at least one or more light emitting layers 442 and 446 and include common layers above and below each light emitting layer 442 and 446 with the light emitting layers 442 and 446 therebetween. For example, specifically, the first stack may include a first hole transport layer 441, a first light emitting layer 442, and a first electron transport layer 443. Further, the second stack may include a second hole transport layer 445, a second light emitting layer 446, and a second electron transport layer 447. Further, the first and second stacks may further include first and second hole injection layers and first and second electron injection layers.

In the meantime, according to the fourth embodiment of the present disclosure, the spacer 460 having an inversed taper is formed between the plurality of sub pixels to partially disconnect the organic layer 440 from the adjacent sub pixels. By doing this, the leakage current is reduced or minimized while driving the display apparatus with a multi-stack structure.

According to the fourth embodiment of the present disclosure, the organic layer 440 at a lower end of the spacer 460 having an inversed taper is deposited on the bank 114 such that the side surface is inclined and the inclined interface has a steep slope angle. Further, a deposition thickness of the organic layer 440 is relatively thinner than that of the other region so that the interval between the charge generation layers 444a and 444b and the second electrode 132 is significantly reduced.

Therefore, according to the fourth embodiment of the present disclosure, the charge blocking layers 450a and 450b are interposed in the inclined interface of the organic layer 440 at the lower end of the spacer 460 having an inversed taper. That is, for example, the first charge blocking layer 450a may be interposed between the charge generation layers 444a and 444b and the second electrode 132 and the second charge blocking layer 450b may be interposed between the charge generation layers 444a and 444b and the first electrode 131. In FIG. 13, an example that the first charge blocking layer 450a is interposed between the second hole transport layer 445 and the second light emitting layer 446 and the second charge blocking layer 450b is interposed between the first light emitting layer 442 and the first electron transport layer 443 has been illustrated. However, the present disclosure is not limited thereto. In the meantime, the first and second charge blocking layers 450a and 450b may extend to the emission area EA at the inclined interface by a selected (or predetermined) distance. Accordingly, the organic layer 440 including the extended first and second charge blocking layers 450a and 450b has a thickness larger than that of the organic layer 440 in the other portion so that a step may be formed on the surface of the organic light emitting diode EL.

Figure 14:
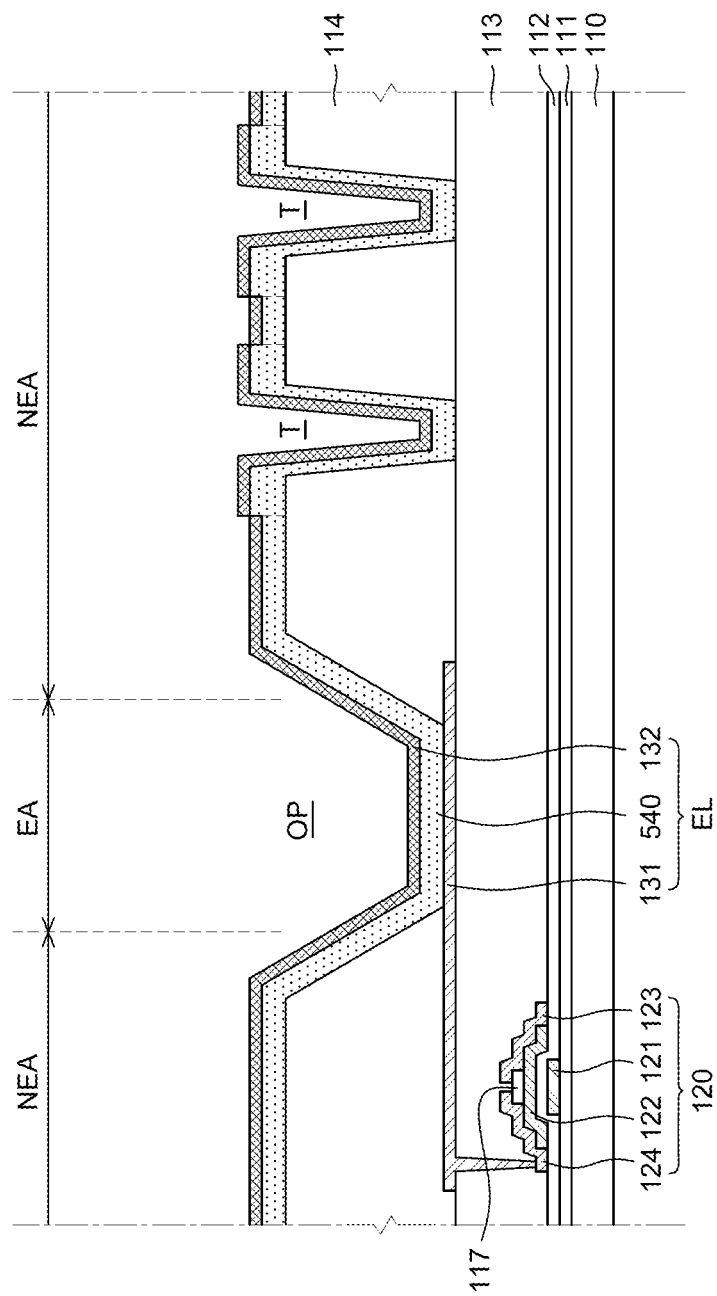
FIG. 14 is a cross-sectional view of a sub pixel according to a fifth embodiment of the present disclosure.

FIG. 14 is a cross-sectional view of a sub pixel according to a fifth embodiment of the present disclosure.

A fifth embodiment of the present disclosure illustrated in FIG. 14 is configured by the substantially same configuration as the first embodiment of the present disclosure except that a plurality of trenches T is provided. Therefore, the redundant description of the same configuration will be omitted.

Referring to FIG. 14, according to the fifth embodiment of the present disclosure, a plurality of trenches T is formed between the plurality of sub pixels to further increase a current path, thereby further reducing or minimizing the leakage current during the driving of the display apparatus, specifically, with a multi-stack structure.

Further, according to the fifth embodiment of the present disclosure, the charge blocking layer is interposed in the organic layer 540 in the trench T. For example, a first charge blocking layer according to the fifth embodiment of the present disclosure may be located between the second electron transport layer and the second electrode and the second charge blocking layer may be located between the first light emitting layer and the first electron transport layer. but the present disclosure is not limited thereto. In the meantime, the first and second charge blocking layers may extend to the emission area EA or an adjacent trench T at the inclined interface by a selected (or predetermined) distance. Accordingly, the organic layer 540 including the extended first and second charge blocking layers has a thickness larger than that of the organic layer 540 in the other portion so that a step may be formed on the surface of the organic light emitting diode EL.

In the meantime, in consideration of functions of the plurality of transistors which configures the pixel circuit, active layers may be configured by different materials, which will be described in detail with a sixth embodiment of the present disclosure.

Figure 15:
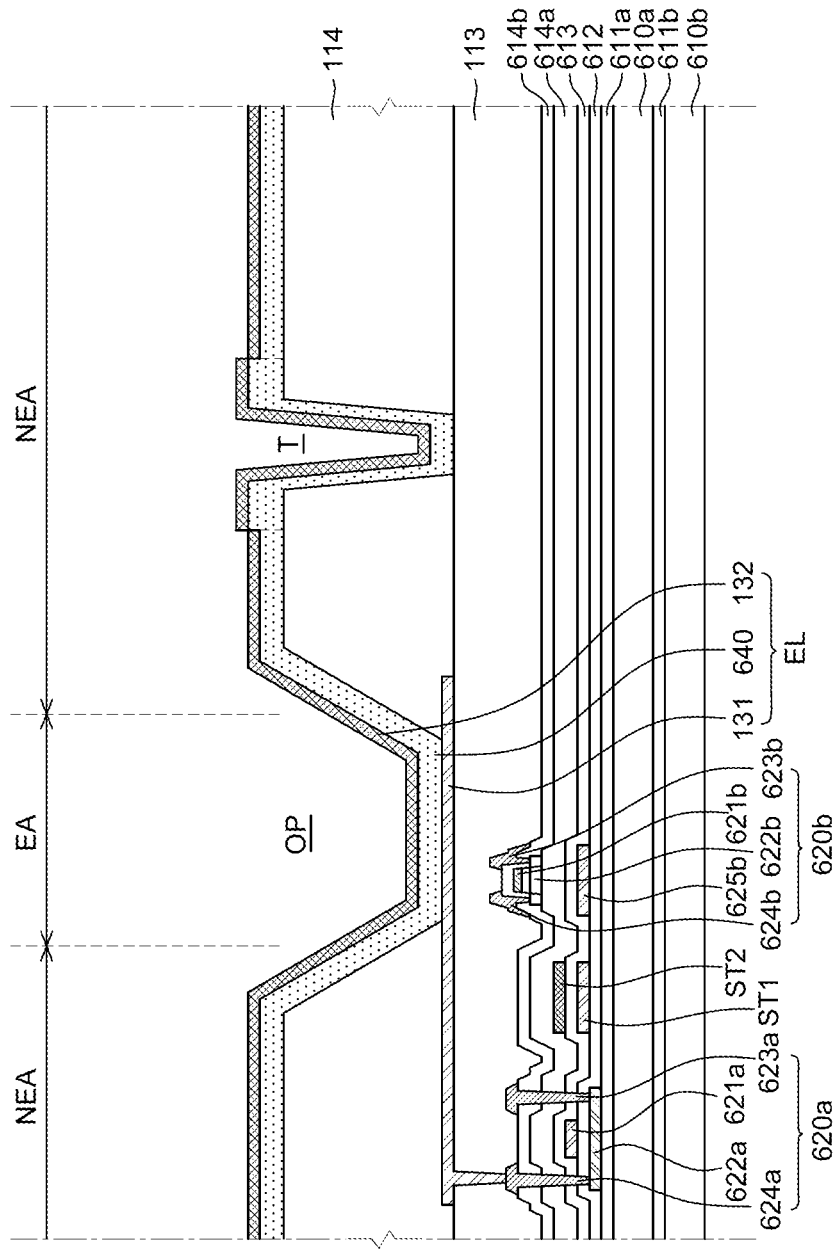
FIG. 15 is a cross-sectional view of a sub pixel according to a sixth embodiment of the present disclosure.

FIG. 15 is a cross-sectional view of a sub pixel according to a sixth embodiment of the present disclosure.

A sixth embodiment of the present disclosure illustrated in FIG. 15 has the substantially same configuration as the display apparatus of the first embodiment of the present disclosure except for first and second transistors 620*a* and 620*b*. Therefore, the redundant description of the same configuration will be omitted.

FIG. 15 illustrates a lower structure as an example, but is not limited thereto.

Further, for the convenience of description, in FIG. 15, only arbitrary first and second transistors 620*a* and 620*b* among a plurality of transistors of a pixel circuit of a sub pixel are illustrated.

Referring to FIG. 15, a display apparatus according to a sixth embodiment of the present disclosure may include first and second substrates 610*a* and 610*b*, first and second transistors 620*a* and 620*b*, a planarization layer 113, an organic light emitting diode EL, a bank 114, and an encapsulating unit (not illustrated).

That is, the display apparatus according to the sixth embodiment of the present disclosure may include a first substrate 610*a* and a second substrate 610*b* and further include a buffer layer 611*b* between the first substrate 610*a* and the second substrate 610*b*.

The first substrate 610*a* and the second substrate 610*b* are support members for supporting other components of the display apparatus and may be configured by an insulating material. For example, the first substrate 610*a* and the second substrate 610*b* may be configured to include plastics such as polymer or polyimide PI or may be formed of a material having a flexibility. Further, the buffer layer 611*b* may be configured by a single layer or a double layer of silicon oxide SiOx or silicon nitride SiNx, but is not limited thereto.

Another buffer layer 611*b* may be disposed on the first substrate 610*a*.

Another buffer layer 611*a* may reduce permeation of moisture or impurities through the first substrate 610*a*. Another buffer layer 611*a* may be configured, for example, by a single layer or a double layer of silicon oxide SiOx or silicon nitride SiNx, but is not limited thereto.

Even though not illustrated, still another buffer layer may be further disposed on another buffer layer 611*a*.

Still another buffer layer may suppress the permeation of ion or impurities generated during a crystallization process of the first transistor 620*a*.

The first and second transistors 620*a* and 620*b* may be disposed on another buffer layer 611*a*.

The first transistor 620*a* may include a first active layer 622*a*, a first gate electrode 621*a*, a first source electrode 623*a*, and a first drain electrode 624*a*.

The second transistor 620*b* may include a second active layer 622*b*, a second gate electrode 621*b*, a second source electrode 623*b*, and a second drain electrode 624*b*.

The first active layer 622*a* may be disposed on another buffer layer 611*a*.

For example, the first active layer 622*a* may be formed of a low temperature polysilicon LTPS. The polysilicon has a high mobility so that energy power consumption is low and a reliability is high. Therefore, the polysilicon may be applied to the driving transistor, and the like.

The gate insulating layer 612 may be disposed on the first active layer 622*a*.

The first gate electrode 621*a* may be disposed on the gate insulating layer 612.

A first storage electrode ST1 and a light shielding layer 625*b* may be disposed on the gate insulating layer 612.

The light shielding layer 625*b* is disposed to overlap the second active layer 622*b* of the second transistor 620*b* to protect the second transistor 620*b* from light introduced from the outside or moisture introduced from the outside to reduce or minimize the deformation of the device characteristic of the second transistor 620*b*. Even though in FIG. 15, it is illustrated that the light shielding layer 625*b* is floated, the light shielding layer 625*b* may be electrically connected to the other configuration, for example, a plurality of wiring lines, but is not limited thereto.

An interlayer insulating layer 613 may be disposed on the first gate electrode 621*a*, the first storage electrode ST1, and the light shielding layer 625*b*.

A second storage electrode ST2 may be disposed on the interlayer insulating layer 613 so as to partially overlap the first storage electrode ST1.

First and second passivation layers 614*a* and 614*b* may be disposed on the second storage electrode ST2. In the first and second passivation layers 614*a* and 614*b*, contact holes through which the first source electrode 623*a* and the first drain electrode 624*a* are connected to the first active layer 622*a*, respectively, may be formed. Further, in the second passivation layer 614*b*, contact holes through which the second source electrode 623*b* and the second drain electrode 624*b* are connected to the second active layer 622*b*, respectively, may be formed.

A second active layer 622*b* may be disposed on the first passivation layer 614*a*.

The second active layer 622*b* may be formed of an oxide semiconductor material. The oxide semiconductor material has a band gap larger than that of silicon so that electrons cannot jump over the band gap in an off state. Therefore, the oxide semiconductor material has a low off-current. Accordingly, a transistor which is formed of an oxide semiconductor material may be applied to a switching transistor which has a short on-time and maintains a long off-time.

A gate insulating layer may be disposed on the second active layer 622*b* and the second gate electrode 621*b* may be disposed on the gate insulating layer.

The gate insulating layer may be patterned as same as the second gate electrode 621*b*.

The first source electrode 623*a* and the first drain electrode 624*a* may be disposed on the second passivation layer 614*b*. The first source electrode 623*a* and the first drain electrode 624*a* which are disposed to be spaced apart from each other may be electrically connected to the first active layer 622*a*. Further, the second source electrode 623*b* and the second drain electrode 624*b* may be disposed on the second passivation layer 614b. The second source electrode 623b and the second drain electrode 624b which are disposed to be spaced apart from each other may be electrically connected to the second active layer 622b.

The planarization layer 113 may be disposed on the second passivation layer 614b.

In FIG. 15, the first active layer 622a of the first transistor 620a is configured by a low temperature polysilicon and the second active layer 622b of the second transistor 620b is configured by an oxide semiconductor material. However, the first active layer 622a may be configured by an oxide semiconductor material or the second active layer 622b may be configured by a low temperature polysilicon, but is not limited thereto.

In the display apparatus according to the sixth embodiment of the present disclosure, the plurality of transistors 620a and 620b of the pixel circuit is configured by different types to improve the performance of the pixel circuit. The pixel circuit may include a plurality of transistors 620a and 620b and a capacitor and the plurality of transistors 620a and 620b may be configured by different types of transistors. For example, a first transistor 620a among the plurality of transistors 620a and 620b has a first active layer 622a configured by a low temperature polysilicon and a second transistor 620b has a second active layer 622b configured by an oxide semiconductor material. The first transistor 620a including low temperature polysilicon has a high mobility and low power consumption so that the transistor may be applied as the driving transistor. The second transistor 620b including an oxide semiconductor material has a short on-time and maintains a long off-time so that the transistor may be applied as a switching transistor. Accordingly, in the display apparatus according to the sixth embodiment of the present disclosure, in consideration of the functions of the plurality of transistors 620a and 620b which configures the pixel circuit, the first and second active layers 622a and 622b may be configured by different materials and the performance of the pixel circuit may be improved.

Referring to FIG. 15, according to the sixth embodiment of the present disclosure, a trench T is formed between the plurality of sub pixels to increase a current path, thereby reducing or minimizing the leakage current during the driving of the display apparatus, specifically, with a multi-stack structure.

Further, according to the sixth embodiment of the present disclosure, a charge blocking layer is interposed in the organic layer 640 in the trench T. In the meantime, the charge blocking layer may extend to the emission area EA at the inclined interface of the trench T by a selected (or predetermined) distance. Accordingly, the organic layer 640 including the extended charge blocking layer may have a thickness larger than that of the organic layer 640 in the other portion so that a step may be formed on the surface of the organic light emitting diode.

The embodiments of the present disclosure can also be described as follows:

According to an aspect of the present disclosure, there is provided a display apparatus. The display apparatus includes a substrate in which an emission area and a non-emission area may be divided and a plurality of sub pixels may be defined, a first electrode disposed in each of the plurality of sub pixels, a bank which may be disposed on an insulating layer above the substrate and exposes the first electrode through an opening, a trench which may be formed by removing a partial area of the bank between the plurality of sub pixels to expose the insulating layer, an organic layer disposed above the substrate in which the bank may be disposed, a charge blocking layer interposed in the organic layer in the trench and a second electrode disposed on the organic layer.

The trench may expose a side surface of the bank.

The organic layer may be in contact with an exposed side surface of the bank and an exposed upper surface of the insulating layer.

A plurality of trenches may be disposed between the plurality of sub pixels.

A side surface of the trench may have a taper steeper than a side surface of the opening, and the organic layer in the trench may be thinner than the organic layer in the opening.

The charge blocking layer may extend toward the emission area at an inclined interface of the trench by a selected (or predetermined) distance and the organic layer including the extended charge blocking layer may be thicker than the organic layer in the other portion.

The sub pixels may include a first sub pixel which emits first color light, a second sub pixel which may emit second color light and a third sub pixel which may emit third color light.

The plurality of third sub pixels may be disposed on the same column and the plurality of first sub pixels and second sub pixels may be alternately disposed in the same column, and the first sub pixel and the second sub pixel may be disposed at the left and the right of the third sub pixel.

In a horizontal direction, the plurality of third sub pixels and the plurality of first and second sub pixels may be alternately disposed, and in a vertical direction, the plurality of third sub pixels may be repeatedly disposed or the plurality of first sub pixels and the plurality of second sub pixels may be alternately disposed.

The trench may be vertically disposed between the plurality of third sub pixels and the plurality of first and second sub pixels and may be horizontally disposed between the plurality of first sub pixels and the plurality of second sub pixels.

Some of trenches may be configured as a single trench and the others may be configured as a double trench.

According to another aspect of the present disclosure, there is provided a display apparatus. The display apparatus includes a substrate in which an emission area and a non-emission area may be divided and a plurality of sub pixels is defined a first electrode disposed in each of the plurality of sub pixels, a bank which may be disposed on an insulating layer above the substrate and may expose the first electrode through an opening, a spacer which may be disposed on the bank between the plurality of sub pixels and may have an inversed taper, an organic layer disposed above the substrate on which the bank and the spacer may be disposed, a charge blocking layer interposed in the organic layer at a lower end of the spacer and a second electrode disposed on the organic layer.

The organic layer at the lower end of the spacer may have an inclined side surface on the bank.

The inclined side surface of the organic layer at the lower end of the spacer may have a slope angle steeper than that of the side surface of the opening and the organic layer at the lower end of the spacer may be thinner than the organic layer in the opening.

The organic layer may include a charge generation layer disposed between the first electrode and the second electrode, a first stack disposed between the charge generation layer and the first electrode and a second stack disposed between the second electrode and the charge generation layer.

The charge blocking layer may include a first charge blocking layer disposed between the charge generation layer and the second electrode and a second charge blocking layer disposed between the charge generation layer and the first electrode.

The charge blocking layer may include a first charge blocking layer disposed between a second hole transport layer and a second light emitting layer of the second stack and a second charge blocking layer disposed between a first light emitting layer and a first electron transport layer of the first stack.

The charge blocking layer may include a first charge blocking layer disposed between a second electron transport layer and a second electrode of the second stack and a second charge blocking layer disposed between a first light emitting layer and a first electron transport layer of the first stack.

The charge blocking layer may include polycarbonate PC and poly methyl methacrylate PMMA.

The charge blocking layer may include a material having a LUMO value of −2.5 eV or lower, such as TCTA[4,4',4"-tris(n-carbazolyl)-triphenylamine], NPD[N,N-Di(1-naphthyl)-N,N'-diphenyl-(1,1'-biphenyl)-4,4'-diamine], and TPD [N,N'-Bis(3-methylphenyl)-N,N'-diphenylbenzidine].

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts and their equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a substrate having thereon an emission area and a non-emission area;
a plurality of sub pixels on the substrate;
an insulating layer on the substrate;
a first electrode disposed in each of the plurality of sub pixels, the first electrode on the insulating layer;
a bank on the insulating layer and the first electrode;
an opening defined within the bank, the opening exposing the first electrode;
a trench defined within the bank at a different location from the opening, the trench exposing the insulating layer, the trench between the plurality of sub pixels;
an organic layer disposed above the substrate in which the bank is disposed;
a charge blocking layer interposed in the organic layer in the trench; and
a second electrode disposed on the organic layer.

2. The display apparatus according to claim 1, wherein the trench exposes a side surface of the bank.

3. The display apparatus according to claim 2, wherein the organic layer is in contact with an exposed side surface of the bank and an exposed upper surface of the insulating layer.

4. The display apparatus according to claim 1, wherein a plurality of trenches is disposed between the plurality of sub pixels.

5. The display apparatus according to claim 1, wherein a side surface of the trench has a taper steeper than a side surface of the opening, and the organic layer in the trench is thinner than the organic layer in the opening.

6. The display apparatus according to claim 1, wherein the charge blocking layer extends toward the emission area at an inclined interface of the trench by a first distance and the organic layer including the extended charge blocking layer is thicker than the organic layer in the other portion.

7. The display apparatus according to claim 1, wherein the sub pixels include:
a first sub pixel which emits first color light;
a second sub pixel which emits second color light; and
a third sub pixel which emits third color light.

8. The display apparatus according to claim 7, wherein the plurality of third sub pixels is disposed on a same column and the plurality of first sub pixels and second sub pixels are alternately disposed in a same column, and the first sub pixel and the second sub pixel are disposed at the left and the right of the third sub pixel.

9. The display apparatus according to claim 7, wherein in a horizontal direction, the plurality of third sub pixels and the plurality of first and second sub pixels are alternately disposed, and in a vertical direction, the plurality of third sub pixels is repeatedly disposed or the plurality of first sub pixels and the plurality of second sub pixels are alternately disposed.

10. The display apparatus according to claim 9, wherein the trench is vertically disposed between the plurality of third sub pixels and the plurality of first and second sub pixels and is horizontally disposed between the plurality of first sub pixels and the plurality of second sub pixels.

11. The display apparatus according to claim 4, wherein some of trenches are configured as a single trench and the others are configured as a double trench.

12. The display apparatus according to claim 1, wherein the organic layer includes:
a charge generation layer disposed between the first electrode and the second electrode;
a first stack disposed between the charge generation layer and the first electrode; and
a second stack disposed between the second electrode and the charge generation layer.

13. The display apparatus according to claim 12, wherein the charge blocking layer includes:
a first charge blocking layer disposed between the charge generation layer and the second electrode; and
a second charge blocking layer disposed between the charge generation layer and the first electrode.

14. The display apparatus according to claim 12, wherein the charge blocking layer includes:
a first charge blocking layer disposed between a second hole transport layer and a second light emitting layer of the second stack; and a second charge blocking layer disposed between a first light emitting layer and a first electron transport layer of the first stack.

15. The display apparatus according to claim 12, wherein the charge blocking layer includes:
   a first charge blocking layer disposed between a second electron transport layer and a second electrode of the second stack; and
   a second charge blocking layer disposed between a first light emitting layer and a first electron transport layer of the first stack.

16. The display apparatus according to claim 12, wherein the charge blocking layer includes polycarbonate PC and poly methyl methacrylate PMMA.

17. The display apparatus according to claim 12, wherein the charge blocking layer includes a material having a LUMO value of −2.5 eV or lower.

18. A display apparatus, comprising:
   a substrate having thereon an emission area and a non-emission area;
   a plurality of sub pixels on the substrate;
   a first electrode disposed in each of the plurality of sub pixels;
   a bank which is disposed on an insulating layer above the substrate and exposes the first electrode through an opening;
   a spacer which is disposed on the bank between the plurality of sub pixels and has an inversed taper;
   an organic layer disposed above the substrate on which the bank and the spacer are disposed, the organic layer including a first organic layer disposed in a portion of the non-emission area at a lower end of the spacer and a second organic layer disposed in the emission area and a remaining portion of the non-emission area;
   a charge blocking layer interposed in the first organic layer at the lower end of the spacer; and
   a second electrode disposed on the organic layer,
   wherein the first organic layer is relatively thicker than the second organic layer, so that a step is present between surfaces of the first organic layer and the second organic layer.

19. The display apparatus according to claim 18, wherein the first organic layer at the lower end of the spacer has an inclined side surface on the bank.

20. The display apparatus according to claim 19, wherein the inclined side surface of the first organic layer at the lower end of the spacer has a slope angle steeper than that of the side surface of the opening and the first organic layer at the lower end of the spacer is thinner than the second organic layer in the opening.

* * * * *